US012183770B2

(12) United States Patent
Kwon et al.

(10) Patent No.: US 12,183,770 B2
(45) Date of Patent: Dec. 31, 2024

(54) DISPLAY DEVICE AND METHOD OF MANUFACTURING THE SAME

(71) Applicant: LG Display Co., Ltd., Seoul (KR)

(72) Inventors: KyuOh Kwon, Paju-si (KR); SeungHo Jang, Paju-si (KR); Jaeyong Choi, Paju-si (KR); JaeMin Sim, Jeongeup-si (KR); SeungJun Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 649 days.

(21) Appl. No.: 17/377,155

(22) Filed: Jul. 15, 2021

(65) Prior Publication Data

US 2022/0020812 A1    Jan. 20, 2022

(30) Foreign Application Priority Data

Jul. 15, 2020 (KR) .......................... 10-2020-0087732

(51) Int. Cl.
*H01L 33/62* (2010.01)
*H01L 27/15* (2006.01)
(Continued)

(52) U.S. Cl.
CPC .......... *H01L 27/156* (2013.01); *H01L 33/005* (2013.01); *H01L 33/12* (2013.01);
(Continued)

(58) Field of Classification Search
CPC ............. H01L 33/52–56; H01L 51/448; H01L 51/5209; H01L 27/3262; H01L 27/3258;
(Continued)

(56) References Cited

U.S. PATENT DOCUMENTS

2012/0161282 A1    6/2012 Bhat et al.
2016/0351457 A1    12/2016 Chen et al.
(Continued)

FOREIGN PATENT DOCUMENTS

CN    102130144 A    7/2011
CN    106206651 A    12/2016
(Continued)

OTHER PUBLICATIONS

Korean Office Action dated Oct. 31, 2024 for Application No. 10-2020-0067732.

*Primary Examiner* — Moin M Rahman
(74) *Attorney, Agent, or Firm* — Birch, Stewart, Kolasch & Birch, LLP

(57) ABSTRACT

A display device according to an example of the present disclosure includes a substrate on which a plurality of sub-pixels are defined; a plurality of LEDs including a first LED, a second LED, and a third LED that are disposed in the plurality of respective sub-pixels on the substrate; and at least one buffer layer disposed between the first LED and the substrate, wherein the first LED is in contact with an upper surface of the at least one buffer layer, and the second LED and the third LED are in contact with an upper surface of the substrate. Accordingly, the plurality of LEDs emitting light of different colors using the buffer layer can be respectively formed on one substrate, thereby allow for omission of a transfer process.

10 Claims, 21 Drawing Sheets

(51) Int. Cl.
 *H01L 33/00* (2010.01)
 *H01L 33/12* (2010.01)
 *H01L 33/38* (2010.01)

(52) U.S. Cl.
 CPC ............ *H01L 33/382* (2013.01); *H01L 33/62* (2013.01); *H01L 2933/0016* (2013.01); *H01L 2933/0066* (2013.01)

(58) Field of Classification Search
 CPC ............... H01L 27/3248; H01L 27/322; H01L 51/5225; H01L 51/5268; H01L 2251/558; H01L 2251/303; H01L 2251/306; H01L 2251/308; H01L 51/5271; H01L 51/5275; H01L 51/0005; H01L 51/5012; H01L 51/5206; H01L 51/5221; H01L 51/56; H01L 27/3244; H01L 2227/323; H01L 33/00–648; H01L 27/15–156; H01L 2933/00–0091; H01L 25/048; H01L 27/14–14893; H01L 31/145–153; H01L 31/165–173; H01L 25/075–0756; H01L 25/13; H01L 25/16–167; H01L 25/18; H01L 33/005; H01L 33/12; H01L 33/382; H01L 33/62; H01L 2933/0016; H01L 2933/0066; H01L 33/007; H01L 25/0753; H01L 27/0255; H01L 27/1214; H01L 33/0062

See application file for complete search history.

(56) References Cited

U.S. PATENT DOCUMENTS

2019/0019779 A1 1/2019 Kwon et al.
2020/0184884 A1* 6/2020 Lau .................. H05B 45/10

FOREIGN PATENT DOCUMENTS

| CN | 107994047 A | 5/2018 |
|----|-------------|--------|
| CN | 109273574 A | 1/2019 |
| JP | 3772708 B2 | 2/2006 |
| KR | 10-2006-0025821 A | 3/2006 |
| KR | 10-2020-0056628 A | 5/2020 |

* cited by examiner

DISPLAY DEVICE AND METHOD OF MANUFACTURING THE SAME

CROSS-REFERENCE TO RELATED APPLICATIONS

This application claims the benefit of and priority to Korean Patent Application No. 10-2020-0087732 filed on Jul. 15, 2020, in the Republic of Korea, the entire contents of which are hereby expressly incorporated by reference into the present application.

BACKGROUND

Technical Field

The present disclosure relates to a display device and a method of manufacturing the display device, and more particularly, to a display device using micro-light emitting diodes (micro-LEDs) and a method of manufacturing the display device.

Discussion of the Related Art

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices. Thus, display devices having a reduced volume and weight while having a wide display area are being studied.

In recent years, display devices including light emitting diodes (LEDs) have received attention as the next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high-brightness image.

SUMMARY OF THE INVENTION

An aspect of the present disclosure is to provide a display device and a method of manufacturing the display device, capable of implementing all of a red LED, a green LED, and a blue LED in the display device in a non-transfer method.

Another aspect of the present disclosure is to provide a display device and a method of manufacturing the display device, in which a plurality of LEDs of the display device are formed by a non-transfer method to allow for simplifying a transfer process of the plurality of LEDs.

Still another aspect of the present disclosure is to provide a display device and a method of manufacturing the display device, in which a process time is shortened by forming a plurality of LEDs and a plurality of driving units on the same substrate.

Still another aspect of the present disclosure is to provide a display device and a method of manufacturing the display device, allowing for simplifying a transfer process of a plurality of LEDs by using a wafer on which a plurality of LEDs are grown as a substrate of the display device.

Still another aspect of the present disclosure is to provide a display device and a method of manufacturing the display device, allowing for easy repair of defective pixels.

Still another aspect of the present disclosure is to provide a display device and a method of manufacturing the display device, in which reliability of a plurality of LEDs is enhanced by forming Zener diodes together.

Yet another aspect of the present disclosure is to provide a display device and a method of manufacturing the display device, in which step differences between a plurality of LEDs and a plurality of driving units are minimized.

Objects of the present disclosure are not limited to the above-mentioned objects, and other objects, which are not mentioned above, can be clearly understood by those skilled in the art from the following descriptions.

A display device according to an exemplary embodiment of the present disclosure includes a substrate on which a plurality of sub-pixels are defined; a plurality of LEDs including a first LED, a second LED, and a third LED that are disposed in the plurality of respective sub-pixels on the substrate; and at least one buffer layer disposed between the first LED and the substrate, wherein the first LED is in contact with an upper surface of the at least one buffer layer, and the second LED and the third LED are in contact with an upper surface of the substrate. Accordingly, the plurality of LEDs emitting light of different colors using the buffer layer can be respectively formed on one substrate, thereby allow for omission of a transfer process.

A method of manufacturing a display device according to another exemplary embodiment of the present disclosure includes forming at least one buffer layer in a partial region of a substrate and growing a first epitaxial layer on an upper surface of the at least one buffer layer; growing a second epitaxial layer on the upper surface of the substrate in another partial area of the substrate; growing a third epitaxial layer on the upper surface of the substrate in another partial area of the substrate; forming a plurality of LEDs by etching portions of the first epitaxial layer, the second epitaxial layer, and the third epitaxial layer and forming an n-type electrode and a p-type electrode on upper portions of the respective first epitaxial layer, second epitaxial layer, and third epitaxial layer that are etched; and forming a plurality of driving units in a remaining area of the substrate, wherein a difference in lattice constant between a lower portion of the first epitaxial layer and the substrate is greater than a difference between a lower portion of the second epitaxial layer and the substrate. Accordingly, the plurality of LEDs can be formed on one substrate by forming the buffer layer to overcome a difference in lattice constant, and the display device can be manufactured in a non-transfer manner by forming the plurality of driving units directly on the substrate on which the plurality of LEDs are formed, so that a process time and a manufacturing cost can be shortened compared to a transfer type display device.

Other detailed matters of the exemplary embodiments are included in the detailed description and the drawings.

According to the present disclosure, a plurality of LEDs are implemented in a display device in a non-transfer method, so that a process time can be shortened compared to a transfer method.

According to the present disclosure, a plurality of LEDs are implemented in a display device in a non-transfer method, so that non-bonding defects of the plurality of LEDs can be minimized.

According to the present disclosure, a non-transfer type display device can be implemented by forming a plurality of lines and a plurality of driving units on a substrate on which a plurality of LEDs emitting light of different colors are grown.

According to the present disclosure, after a lighting test, a defective pixel can be selectively repaired, so that a yield of a display device can be improved.

According to the present disclosure, reliability of a plurality of LEDs can be improved by forming Zener diodes without adding a separate process.

According to the present disclosure, step differences between a plurality of LEDs and a plurality of driving units can be reduced, thereby minimizing a short circuit of a plurality of lines connecting the plurality of LEDs and the plurality of driving units.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

FIG. 4A to FIG. 4I are schematic process diagrams illustrating a method of manufacturing the display device according to an exemplary embodiment of the present disclosure.

DETAILED DESCRIPTION OF THE EMBODIMENTS

Figure 1:
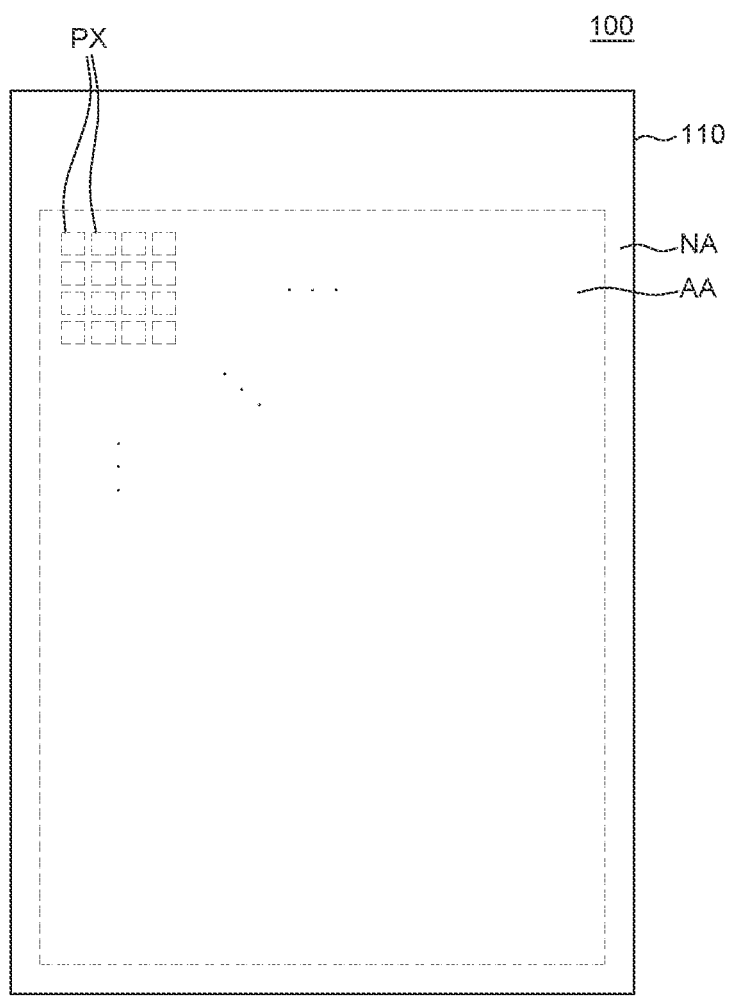
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

FIG. 1 is a schematic plan view of a display device according to an exemplary embodiment of the present disclosure. In FIG. 1, a substrate 110 and pixels PX are illustrated among various components of a display device 100 for convenience of description.

Referring to FIG. 1, the substrate 110 is a component for supporting various components included in the display device 100. For example, the substrate 110 can be formed of sapphire, gallium nitride (GaN), gallium arsenide (GaAs), gallium phosphorus (GaP), silicon (Si), or the like. Further, the substrate 110 can be formed of a polymer or plastic, or can be formed of a plastic material having flexibility. Hereinafter, descriptions will be made on the assumption that the substrate 110 is a silicon substrate 110 doped with a p-type impurity, but is not limited thereto.

The substrate 110 includes a display area AA and a non-display area NA. The display area AA is an area where a plurality of pixels PX are disposed to display an image. Display elements, a driving circuit for driving the display elements, and the like can be disposed in the plurality of pixels PX of the display area AA. The driving circuit can include various transistors, storage capacitors, and lines for driving the pixels PX. For example, the driving circuit can be configured of various components such as a driving transistor, a switching transistor, a storage capacitor, a gate line, and a data line, but is not limited thereto.

The non-display area NA is an area where an image is not displayed and is an area where various lines and driver ICs for driving the plurality of pixels PX disposed in the display area AA are disposed. For example, in the non-display area NA, various ICs such as a gate driver IC and a data driver IC, and link lines for transferring various signals to the display area AA can be disposed.

The plurality of pixels PX are defined in the display area AA of the substrate 110. The plurality of pixels PX are individual units that emit light, and each of the plurality of pixels PX can include a plurality of sub-pixels, and a combination of the plurality of sub-pixels can allow one pixel PX to emit light of various colors. For example, each of the plurality of pixels PX can include a red sub-pixel, a green sub-pixel, and a blue sub-pixel, but is not limited thereto.

Hereinafter, FIG. 2 to FIG. 3B will be referred together for a detailed description of the plurality of pixels PX.

Figure 2:
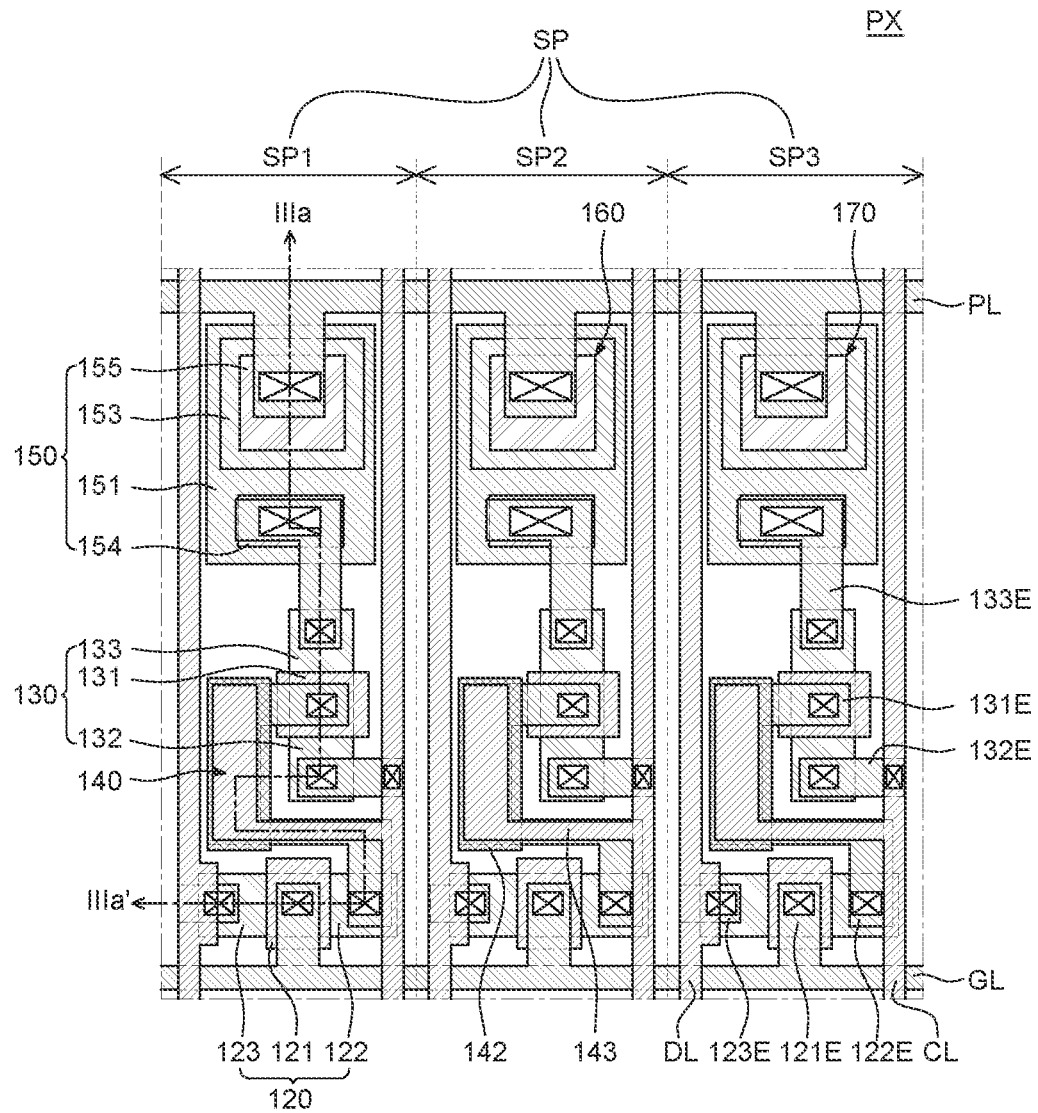
FIG. 2 is an enlarged plan view of one pixel of the display device according to an exemplary embodiment of the present disclosure.
Figure 3A:
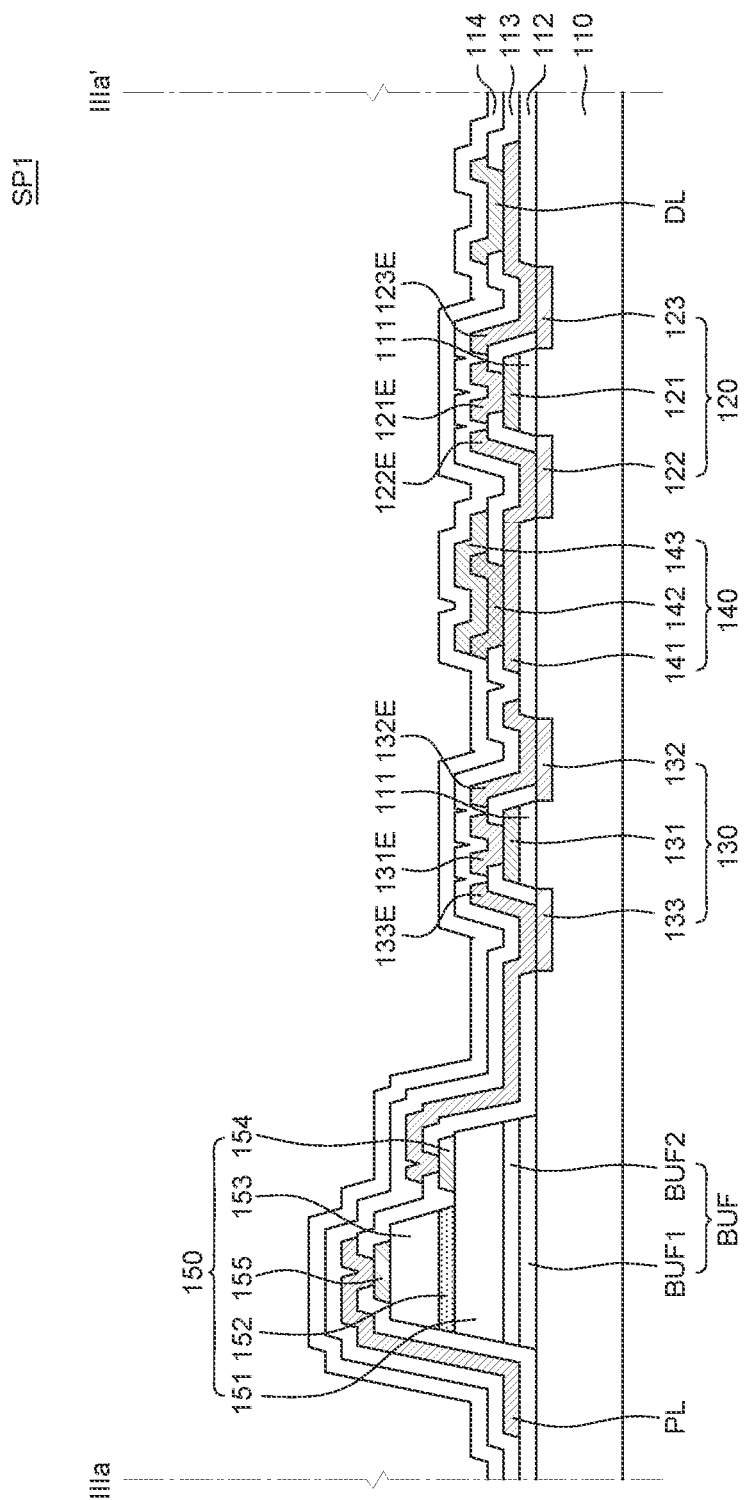
FIG. 3A is a cross-sectional view taken along line IIIa-IIIa' of FIG. 2.

FIG. 2 is an enlarged plan view of one pixel of the display device according to an exemplary embodiment of the present disclosure. FIG. 3A is a cross-sectional view taken along line IIIa-IIIa' of FIG. 2. FIG. 3B is a cross-sectional view of a plurality of sub-pixels of the display device according to an exemplary embodiment of the present disclosure.

Particularly, FIG. 3A is a cross-sectional view of a first sub-pixel SP1 of the display device 100 according to an exemplary embodiment of the present disclosure. FIG. 3B is a cross-sectional view of a first light emitting diode (LED) 150 of a first sub-pixel SP1, a second LED 160 of a second sub-pixel SP2, and a third LED 170 of a third sub-pixel SP3 in the display device 100 according to an exemplary embodiment of the present disclosure.

Figure 3B:
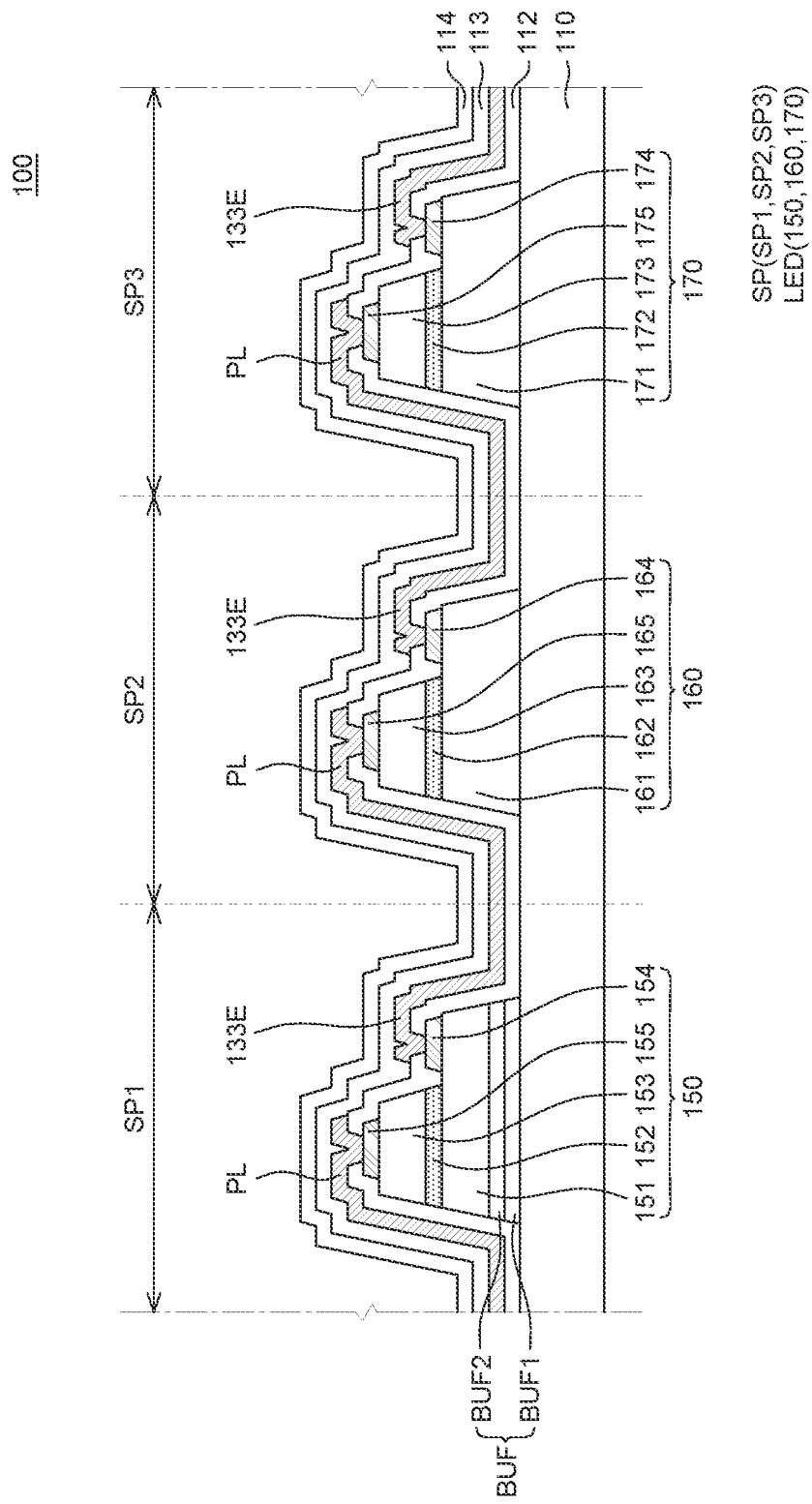
FIG. 3B is a cross-sectional view of a plurality of sub-pixels of the display device according to an exemplary embodiment of the present disclosure.

Referring to FIG. 2 to FIG. 3B, the display device 100 according to an exemplary embodiment of the present disclosure includes a plurality of LEDs, a plurality of driving units DP, a plurality of lines, a buffer layer BUF, a gate insulating layer 111, and a plurality of passivation layers 112, 113, and 114.

Referring to FIG. 2, a plurality of sub-pixels SP include a first sub-pixel SP1, a second sub-pixel SP2, and a third sub-pixel SP3. The first sub-pixel SP1, the second sub-pixel SP2, and the third sub-pixel SP3 can display light of different colors. For example, the first sub-pixel SP1, the second sub-pixel SP2, and the third sub-pixel SP3 can be one of red sub-pixels that emit red light, green sub-pixels that emit green light, and blue sub-pixels that emit blue light. Hereinafter, descriptions will be made on the assumption that the first sub-pixel SP1 is a red sub-pixel, the second sub-pixel SP2 is a green sub-pixel, and the third sub-pixel SP3 is a blue sub-pixel, but is not limited thereto.

The plurality of LEDs are disposed on the substrate 110. The plurality of LEDs are respectively disposed in the plurality of sub-pixels SP. The plurality of LEDs are elements that emit light when a voltage is applied. The plurality of LEDs can include LEDs that emit red light, green light, blue light, and the like, and a combination of these LEDs can implement light of various colors including white. In addition, the plurality of LEDs can be micro-LEDs, which are very small sized LEDs so as to implement images of a high contrast ratio and high resolution.

The plurality of LEDs include the first LED 150, the second LED 160 and the third LED 170.

The first LED 150 is disposed in the first sub-pixel SP1, the second LED 160 is disposed in the second sub-pixel SP2, and the third LED 170 is disposed in the third sub-pixel SP3. Meanwhile, when the plurality of LEDs respectively emit light of different colors, a portion of the LEDs can be a red LED emitting red light, another portion of the LEDs can be a green LED emitting green light, and a remainder of the LEDs can be a blue LED emitting blue light. In addition, since the plurality of LEDs respectively emit light of different colors, a member such as a light conversion layer or the like can be omitted. For example, the first LED 150 disposed in the first sub-pixel SP1, which is a red sub-pixel, can be a red LED, the second LED 160 disposed in the second sub-pixel SP2, which is a green sub-pixel, can be a green LED, and the third LED 170 disposed in the third sub-pixel SP3, which is a blue sub-pixel, can be a blue LED.

Referring to FIG. 3A and FIG. 3B, the first LED 150 includes a first n-type semiconductor layer 151, a first emission layer 152, a first p-type semiconductor layer 153, a first n-type electrode 154, and a first p-type electrode 155.

The first n-type semiconductor layer 151 is disposed on the substrate 110, and the first p-type semiconductor layer 153 is disposed on the first n-type semiconductor layer 151. The first n-type semiconductor layer 151 and the first p-type semiconductor layer 153 can be layers formed by doping an n-type impurity and a p-type impurity in a specific material. For example, the first n-type semiconductor layer 151 can be formed by doping an n-type impurity in indium aluminum phosphide (InAlP), and the first p-type semiconductor layer 153 can be formed by doping a p-type impurity in gallium arsenide (GaAs). For example, the p-type impurity can be magnesium (Mg), zinc (Zn), beryllium (Be), or the like, and the n-type impurity can be silicon (Si), germanium (Ge), tin (Sn), or the like, but the present disclosure is not limited thereto.

The first emission layer 152 is disposed between the first n-type semiconductor layer 151 and the first p-type semiconductor layer 153. The first emission layer 152 can emit light by receiving holes and electrons from the first n-type semiconductor layer 151 and the first p-type semiconductor layer 153. For example, the first emission layer 152 can emit red light by receiving holes and electrons from the first n-type semiconductor layer 151 and the first p-type semiconductor layer 153. The first emission layer 152 can be configured of a single layer or a multi-quantum well (MQW) structure, and can be formed of, for example, indium gallium nitride (InGaN) or gallium nitride (GaN), but is limited thereto.

A portion of the first n-type semiconductor layer 151 protrudes outwardly of the first emission layer 152 and the first p-type semiconductor layer 153. The first emission layer 152 and the first p-type semiconductor layer 153 can have a size smaller than that of the first n-type semiconductor layer 151 so as to expose an upper surface of the first n-type semiconductor layer 151. The first n-type semiconductor layer 151 can be exposed from the first emission layer 152 and the first p-type semiconductor layer 153 so as to be electrically connected to the first n-type electrode 154.

The first n-type electrode 154 is disposed on the first n-type semiconductor layer 151, and the first p-type electrode 155 is disposed on the first p-type semiconductor layer 153. The first n-type electrode 154 is in contact with the upper surface of the first n-type semiconductor layer 151 and can be electrically connected to the first n-type semiconductor layer 151, and the first p-type electrode 155 is in contact with an upper surface of the first p-type semiconductor layer 153 and can be electrically connected to the first p-type semiconductor layer 153.

The buffer layer BUF is disposed between the first LED 150 and the substrate 110. The buffer layer BUF is a layer for reducing a difference in lattice constant between the first LED 150 and the substrate 110 and can be formed of at least one layer. For example, the buffer layer BUF includes a first buffer layer BUF1 on the substrate 110 and a second buffer layer BUF2 on the first buffer layer BUF1.

The lattice constant is a constant representing a crystal structure. When a plurality of LEDs are formed, a semiconductor crystal having a lattice constant similar to that of the substrate 110 can be grown to form a plurality of LEDs. However, a semiconductor crystal having a lattice constant that is not similar to that of the substrate 110 can be difficult to grow. Even if the semiconductor crystal is grown, the plurality of LEDs can be defective, and internal quantum efficiency of the LEDs can decrease. Accordingly, the buffer layer BUF can be first formed on the substrate 110 to reduce a difference in lattice constant, and the first LED 150 can be formed on the buffer layer BUF. The buffer layer BUF can be formed of various materials depending on a material forming the substrate 110 and a material of a first epitaxial layer for forming a plurality of first LEDs 150. For example, when the substrate 110 is a silicon substrate 110, the first buffer layer BUF1 can be formed of germanium (Ge), and the second buffer layer BUF2 can be formed of gallium arsenide (n-GaAs), but the present disclosure is not limited thereto.

Referring to FIG. 3B, the second LED 160 includes a second n-type semiconductor layer 161, a second emission layer 162, a second p-type semiconductor layer 163, a second n-type electrode 164, and a second p-type electrode 165.

The second n-type semiconductor layer 161 and the second p-type semiconductor layer 163 can be layers formed by doping an n-type impurity and a p-type impurity in a material such as gallium nitride (GaN). For example, the p-type impurity can be magnesium (Mg), zinc (Zn), beryllium (Be), or the like, and the n-type impurity can be silicon (Si), germanium (Ge), tin (Sn), or the like, but the present disclosure is not limited thereto.

The second emission layer 162 is disposed between the second n-type semiconductor layer 161 and the second p-type semiconductor layer 163. The second emission layer 162 can emit light by receiving holes and electrons from the second n-type semiconductor layer 161 and the second p-type semiconductor layer 163. For example, the second emission layer 162 can emit green light by receiving holes and electrons from the second n-type semiconductor layer 161 and the second p-type semiconductor layer 163. The second emission layer 162 can be configured of a single layer or a multi-quantum well (MQW) structure, and can be formed of, for example, indium gallium nitride (InGaN) or gallium nitride (GaN), but is limited thereto.

A portion of the second n-type semiconductor layer 161 protrudes outwardly of the second emission layer 162 and the second p-type semiconductor layer 163. The second emission layer 162 and the second p-type semiconductor layer 163 can have a size smaller than that of the second n-type semiconductor layer 161 so as to expose an upper surface of the second n-type semiconductor layer 161. The second n-type semiconductor layer 161 can be exposed from the second emission layer 162 and the second p-type semiconductor layer 163 so as to be electrically connected to the second n-type electrode 164.

The second n-type electrode 164 and the second p-type electrode 165 are disposed on the second n-type semiconductor layer 161 and the second p-type semiconductor layer 163, respectively. The second n-type electrode 164 is in contact with the upper surface of the second n-type semiconductor layer 161 and can be electrically connected to the second n-type semiconductor layer 161. The second p-type electrode 165 is in contact with an upper surface of the second p-type semiconductor layer 163 and can be electrically connected to the second p-type semiconductor layer 163.

The third LED 170 includes a third n-type semiconductor layer 171, a third emission layer 172, a third p-type semiconductor layer 173, a third n-type electrode 174, and a third p-type electrode 175.

The third n-type semiconductor layer 171 and the third p-type semiconductor layer 173 can be layers formed by doping an n-type impurity and a p-type impurity in a material such as gallium nitride (GaN). For example, the p-type impurity can be magnesium (Mg), zinc (Zn), beryllium (Be), or the like, and the n-type impurity can be silicon (Si), germanium (Ge), tin (Sn), or the like, but the present disclosure is not limited thereto.

The third emission layer 172 is disposed between the third n-type semiconductor layer 171 and the third p-type semiconductor layer 173. The third emission layer 172 can emit light by receiving holes and electrons from the third n-type semiconductor layer 171 and the third p-type semiconductor layer 173. For example, the third emission layer 172 can emit blue light by receiving holes and electrons from the third n-type semiconductor layer 171 and the third p-type semiconductor layer 173. The third emission layer 172 can be configured of a single layer or a multi-quantum well (MQW) structure, and can be formed of, for example, indium gallium nitride (InGaN) or gallium nitride (GaN), but is limited thereto.

A portion of the third n-type semiconductor layer 171 protrudes outwardly of the third emission layer 172 and the third p-type semiconductor layer 173. The third emission layer 172 and the third p-type semiconductor layer 173 can have a size smaller than that of the third n-type semiconductor layer 171 so as to expose an upper surface of the third n-type semiconductor layer 171. The third n-type semiconductor layer 171 can be exposed from the third emission layer 172 and the third p-type semiconductor layer 173 so as to be electrically connected to the third n-type electrode 174.

The third n-type electrode 174 and the third p-type electrode 175 are disposed on the third n-type semiconductor layer 171 and the third p-type semiconductor layer 173, respectively. The third n-type electrode 174 is in contact with the upper surface of the third n-type semiconductor layer 171 and can be electrically connected to the third n-type semiconductor layer 171, and the third p-type electrode 175 is in contact with an upper surface of the third p-type semiconductor layer 173 and can be electrically connected to the third p-type semiconductor layer 173.

Referring to FIGS. 2 and 3A, the plurality of driving units DP are disposed on the substrate 110. The plurality of driving units DP are respectively disposed in the plurality of sub-pixels SP and include a plurality of transistors 120 and 130 and a storage capacitor 140. The plurality of driving units DP are driving circuits for driving the plurality of LEDs and can be electrically connected to the plurality of LEDs.

The plurality of transistors 120 and 130 can be used as driving elements of the display device 100. The plurality of transistors can be, for example, field effect transistors (FETs) such as a thin film transistor (TFT), an N-channel metal oxide semiconductor (NMOS), a P-channel metal oxide semiconductor (PMOS), a complementary metal oxide semiconductor (CMOS), and the like, but are not limited thereto. Hereinafter, descriptions will be made on the assumption that the plurality of transistors 120 and 130 are field effect transistors, but are not limited thereto.

The plurality of transistors 120 and 130 include a first transistor 120 and a second transistor 130. Each of the first transistor 120 and the second transistor 130 includes gate electrodes 121 and 131, source regions 122 and 132, and drain regions 123 and 133. The first transistor 120 and the second transistor 130 can be P-type transistors or N-type transistors. In the P-type transistor, since holes flow from the source region to the drain region, current can flow from the source region to the drain region. In the N-type transistor, since electrons flow from the source region to the drain region, current can flow from the drain region to the source region. Hereinafter, it is assumed that the first transistor 120 and the second transistor 130 are N-type transistors, but types of the first transistor 120 and the second transistor 130 can vary depending on a polarity of the substrate 110. However, the present disclosure is not limited thereto.

The first transistor 120 includes a first gate electrode 121, a first source region 122, and a first drain region 123.

The first source region 122 and the first drain region 123 that are spaced apart from each other are formed on the substrate 110. The first source region 122 and the first drain region 123 can be formed by doping an n-type impurity or a p-type impurity in the substrate 110. When the substrate 110 is a p-type substrate 110, the first source region 122 and the first drain region 123 can be formed by doping an n-type impurity such as arsenic or phosphorus. And, when the substrate 110 is an n-type substrate 110, the first source region 122 and the first drain region 123 can be formed by doping a p-type impurity such as boron or the like in the substrate 110. Hereinafter, descriptions will be made on the assumption that the substrate 110 is the p-type substrate 110, and the n-type impurity is doped in the first source region 122 and the first drain region 123, but the present disclosure is not limited thereto.

The gate insulating layer 111 is disposed between the first source region 122 and the first drain region 123. The gate insulating layer 111 is a layer for insulating the first source region 122 and the first drain region 123 from the first gate electrode 121 and can be formed of an insulating material. For example, the gate insulating layer 111 can be configured of a single layer or multiple layers of silicon oxide (SiOx) or silicon nitride (SiNx), but is not limited thereto.

The first gate electrode 121 is disposed on the gate insulating layer 111. The first gate electrode 121 can be electrically connected to a gate line GL. When a gate voltage is applied to the first gate electrode 121 from the gate line GL, the first transistor 120 can be turned on. The first gate electrode 121 can be formed of, for example, a conductive material such as poly silicon or molybdenum (Mo), but is not limited thereto.

The first passivation layer 112 is disposed on the plurality of LEDs and the first transistor 120. The first passivation layer 112 is a layer for protecting components under the first passivation layer 112 and can be formed of an insulating material. The first passivation layer 112 can be formed of, for example, a single layer or multiple layers of silicon oxide (SiOx) or silicon nitride (SiNx), but is not limited thereto.

A first gate connection electrode 121E, a first source connection electrode 122E, and a first drain connection electrode 123E are disposed on the first passivation layer 112. Each of the first gate connection electrode 121E, the first source connection electrode 122E, and the first drain connection electrode 123E can be electrically connected to the first gate electrode 121, the first source region 122, and the first drain region 123, respectively.

The first gate connection electrode 121E electrically connects the first gate electrode 121 and the gate line GL. The first gate connection electrode 121E can be formed integrally with the gate line GL to contact the first gate electrode 121. A contact hole that exposes an upper surface of the first gate electrode 121 can be formed in the first passivation layer 112, and the first gate connection electrode 121E can contact the upper surface of the first gate electrode 121 through the contact hole. Accordingly, the gate line GL and the first gate electrode 121 can be electrically connected through the first gate connection electrode 121E.

The first source connection electrode 122E electrically connects the first source region 122 and the second transistor 130. A contact hole that exposes the first source region 122 can be formed in the first passivation layer 112, and the first source connection electrode 122E can contact the first source region 122 through the contact hole. In addition, the first source connection electrode 122E in contact with the first source region 122 can extend toward the second transistor 130 to be electrically connected to the second transistor 130. Accordingly, the first source region 122 of the first transistor 120 and the second transistor 130 can be electrically connected by the first source connection electrode 122E.

The first drain connection electrode 123E electrically connects the first drain region 123 and the data line DL. A contact hole that exposes the first drain region 123 can be formed in the first passivation layer 112, and the first drain connection electrode 123E can contact the first drain region 123 through the contact hole. In addition, the first drain connection electrode 123E in contact with the first drain region 123 can extend toward the data line DL to be electrically connected to the data line DL. Accordingly, the first drain region 123 and the data line DL can be electrically connected through the first drain connection electrode 123E.

The second transistor 130 includes a second gate electrode 131, a second source region 132, and a second drain region 133.

The second source region 132 and the second drain region 133 that are spaced apart from each other are formed on the substrate 110. The second source region 132 and the second drain region 133 can be formed by doping an n-type impurity or a p-type impurity in the substrate 110. As described above, descriptions will be made on the assumption that the substrate 110 is a p-type substrate 110 and an n-type impurity is doped in the second source region 132 and the second drain region 133, but the present disclosure is not limited thereto.

The gate insulating layer 111 is disposed between the second source region 132 and the second drain region 133, and the second gate electrode 131 is disposed on the gate insulating layer 111. The second gate electrode 131 can be formed of a conductive material such as polysilicon or molybdenum (Mo), but is not limited thereto.

The second gate electrode 131 is electrically connected to the first source region 122 of the first transistor 120. The second gate electrode 131 can be electrically connected to the first source region 122 through the first source connection electrode 122E. The first transistor 120 can transmit a voltage to the second transistor 130 through the first source connection electrode 122E, and control the second transistor 130 to be turned on or off.

The first passivation layer 112 is disposed on the second transistor 130, and a second gate connection electrode 131E, a second source connection electrode 132E, and a second drain connection electrode 133E are disposed on the first passivation layer 112. The second gate connection electrode 131E, the second source connection electrode 132E, and the second drain connection electrode 133E can be electrically connected to the second gate electrode 131, the second source region 132, and the second drain region 133, respectively.

The second gate connection electrode 131E electrically connects the second gate electrode 131 and the first source region 122 of the first transistor 120. A contact hole that exposes the second gate electrode 131 can be formed in the first passivation layer 112, and the second gate connection electrode 131E can contact the second gate electrode 131 through the contact hole. In this case, the second gate connection electrode 131E can be formed integrally with the first source connection electrode 122E. Accordingly, the second gate electrode 131 can be electrically connected to the first source region 122 of the first transistor 120 through the second gate connection electrode 131E and the first source connection electrode 122E.

The second source connection electrode 132E electrically connects the second source region 132 and the common line CL. A contact hole that exposes the second source region 132 can be formed in the first passivation layer 112, and the second source connection electrode 132E can contact the second source region 132 through the contact hole. In addition, the second source connection electrode 132E in contact with the second source region 132 can extend toward the common line CL to be electrically connected to the common line CL. Accordingly, the second source region 132 of the second transistor 130 and the common line CL can be electrically connected by the second source connection electrode 132E.

The second drain connection electrode 133E electrically connects each of the plurality of LEDs and the second drain region 133. The second drain connection electrodes 133E disposed in each of the plurality of sub-pixels SP can electrically connect each of the first n-type electrode 154 of the first LED 150, the second n-type electrode 164 of the second LED 160 and the third n-type electrode 174 of the third LED 170 to the second drain region 133 of the second transistor 130. A contact hole that exposes the second drain region 133 can be formed in the first passivation layer 112, and the second drain connection electrode 133E can contact the second drain region 133 through the contact hole. In addition, the second drain connection electrode 133E in contact with the second drain region 133 can extend toward each of the plurality of LEDs to be electrically connected to the n-type electrode 154, 164, or 174 of each of the plurality of LEDs. Accordingly, the second drain region 133 of the second transistor 130 and each of the plurality of LEDs can be electrically connected through the second drain connection electrode 133E.

The gate line GL and a power line PL are disposed on the first passivation layer 112. The gate line GL transfers a gate voltage to the driving unit DP of each of the plurality of sub-pixels SP. Specifically, the gate line GL can transmit a gate voltage to the first gate electrode 121 of the first transistor 120 of each of the plurality of sub-pixels SP. The gate line GL can be disposed from the display area AA to the non-display area NA. In addition, the gate line GL can receive a gate voltage from a gate driver IC disposed in the non-display area NA and transmit the gate voltage to the first gate electrode 121 of a first transistor 120 of each of the plurality of driving units DP.

The power line PL transmits a power voltage to the plurality of LEDs of the plurality of respective sub-pixels SP. The power line PL can transmit the power voltage to the p-type electrodes 155, 165, and 175 of the plurality of respective LEDs. The power line PL can be electrically connected to the first p-type electrode 155 of the first LED 150, the second p-type electrode 165 of the second LED 160, and the third p-type electrode 175 of the third LED 170 and transmit the power voltage to the plurality of LEDs. In this case, the power line PL can extend toward the p-type electrodes 155, 165, and 175 of the plurality of respective LEDs to be electrically connected to the plurality of LEDs. For example, the power line PL that is adjacent to the first sub-pixel SP1 can extend toward the first p-type electrode 155 of the first LED 150 and can be electrically connected to the first p-type electrode 155 through the contact hole formed in the first passivation layer 112. The power line PL can be disposed from the display area AA to the non-display area NA and can receive a power voltage from a driving IC disposed in the non-display area NA and transmit the power voltage to the plurality of LEDs of the plurality of sub-pixels SP.

The second passivation layer 113 is disposed on the gate line GL, the power line PL, the first gate connection electrode 121E, the first source connection electrode 122E, the first drain connection electrode 123E, the second gate connection electrode 131E, the second source connection electrode 132E, and the second drain connection electrode 133E. The second passivation layer 113 is a layer for protecting and insulating components under the second passivation layer 113 and can be formed of an insulating material. For example, the second passivation layer 113 can be configured of a single layer or multiple layers of silicon oxide (SiOx) or silicon nitride (SiNx), but is not limited thereto.

The data line DL is disposed on the second passivation layer 113. The data line DL transmits a data voltage to the driving unit DP of each of the plurality of sub-pixels SP. Specifically, the data line DL can transmit the data voltage to the first drain region 123 of the first transistor 120 of each of the plurality of sub-pixels SP. The data line DL can be disposed from the display area AA to the non-display area NA. The data line DL can receive a data voltage from a data driver IC disposed in the non-display area NA and transmit the data voltage to the first transistor 120 of each of the plurality of driving units DP.

The common line CL is disposed on the second passivation layer 113. The common line CL transmits a common voltage to the driving unit DP of each of the plurality of sub-pixels SP. Specifically, the common line CL can transmit a common voltage to the second source region 132 of the second transistor 130 of each of the plurality of sub-pixels SP. The common line CL can be disposed from the display area AA to the non-display area NA. The common line CL can receive a common voltage from the driver IC disposed in the non-display area NA and transmit the common voltage to the second transistor 130 of each of the plurality of driving units DP.

The storage capacitor 140 is disposed in each of the plurality of sub-pixels SP. The storage capacitor 140 can maintain a potential difference between the second gate electrode 131 and the second source region 132 of the second transistor 130. The storage capacitor 140 can store a data voltage to maintain a potential difference between the second gate electrode 131 and the second source region 132 and allow the plurality of LEDs to be maintained in the same state until a next gate voltage is applied to the gate line GL. The storage capacitor 140 includes a first capacitor electrode 141, a second capacitor electrode 143, and a dielectric layer 142.

The first capacitor electrode 141 is disposed on the first passivation layer 112. The first capacitor electrode 141 can be electrically connected to the first source region 122 and the second gate electrode 131. Specifically, the first capacitor electrode 141 can be disposed to extend from the first source connection electrode 122E that electrically connects the first source region 122 and the second gate electrode 131. The first capacitor electrode 141 can be integrally formed with the first source connection electrode 122E and the second gate connection electrode 131E and electrically connected to the second gate electrode 131.

The second capacitor electrode 143 is disposed to overlap the first capacitor electrode 141, on the second passivation layer 113. The second capacitor electrode 143 can be electrically connected to the common line CL and the second source region 132 of the second transistor 130. Specifically, the second capacitor electrode 143 can extend from the common line CL, and the second capacitor electrode 143 and the common line CL can be integrally formed. In addition, the second capacitor electrode 143 can be electrically connected to the second source region 132 through the common line CL that is electrically connected to the second source region 132 and the second source connection electrode 132E of the second transistor 130.

Therefore, the first capacitor electrode 141 of the storage capacitor 140 is electrically connected to the second gate electrode 131, and the second capacitor electrode 143 is electrically connected to the second source region 132, so that a potential difference between the second gate electrode 131 and the second source region 132 of the second transistor 130 can be maintained.

The dielectric layer 142 is disposed between the first capacitor electrode 141 and the second capacitor electrode 143. A contact hole that exposes the first capacitor electrode 141 can be formed in the second passivation layer 113, and the dielectric layer 142 can be disposed to fill the contact hole. The dielectric layer 142 can insulate the first capacitor electrode 141 from the second capacitor electrode 143 and at the same time, improve capacity of the storage capacitor 140. A dielectric permittivity of the dielectric layer 142 can be proportional to the capacity of the storage capacitor 140, and the dielectric layer 142 can be formed of a high dielectric permittivity material having a large dielectric constant to improve the capacity of the storage capacitor 140. However, the dielectric layer 142 can be omitted, and the second passivation layer 113 can function as a dielectric layer that insulates the first capacitor electrode 141 and the second capacitor electrode 143 and forms the storage capacitor 140.

The third passivation layer 114 is disposed on the data line DL, the common line CL, and the second capacitor electrode 143. The third passivation layer 114 is a layer to protect and insulate components under the third passivation layer 114 and can be formed of an insulating material. For example, the third passivation layer 114 can be configured of a single layer or multiple layers of silicon oxide (SiOx) or silicon nitride (SiNx), but is not limited thereto.

Conventionally, a display device was manufactured by forming a plurality of LEDs and a plurality of driving units on different substrate and then, transferring the plurality of LEDs to the substrate on which the plurality of driving units are formed. However, when each of the plurality of LEDs is individually transferred, a process can take a long time and a low yield can be caused, thus increasing a manufacturing cost.

In addition, there is a limitation in that growth efficiency of each of the plurality of LEDs differs depending on a type of substrate. Specifically, blue LEDs and green LEDs are easy to grow on the same substrate, but when red LEDs are grown on the same substrate as blue LEDs and/or green LEDs, the growth efficiency of the red LEDs differs from those of blue LEDs and/or green LEDs, so that it can be difficult to grow red, green, and blue LEDs on one substrate together. Therefore, even if a plurality of driving units are formed on a substrate on which a plurality of LEDs are grown, some LEDs that are difficult to grow on the corresponding substrate are able to be disposed on a display device only by a transfer method, which is disadvantageous in terms of yield and manufacturing costs.

On the other hand, in the display device 100 according to an exemplary embodiment of the present disclosure, a plurality of first LEDs 150, a plurality of second LEDs 160, and a plurality of third LEDs 170 are all grown on one substrate 110 using the buffer layer BUF, and a plurality of driving units DP are formed on the substrate 110 on which the plurality of LEDs are grown, so that a non-transfer type display device 100 can be implemented. That is, a plurality of LEDs emitting light of different colors are grown on one substrate 110, and a plurality of driving units DP are also formed directly on the substrate 110 on which the plurality of LEDs are grown, so that a transfer process of the plurality of LEDs can be simplified, and an alignment error between the plurality of LEDs and the plurality of driving units DP can be reduced.

Hereinafter, the display device 100 according to an exemplary embodiment of the present disclosure and a method of manufacturing the display device 100 will be described in detail with reference to FIG. 4A to FIG. 4I.

FIG. 4A to FIG. 4I are schematic process diagrams illustrating a method of manufacturing the display device according to an exemplary embodiment of the present disclosure. Specifically, FIG. 4A to FIG. 4E are schematic cross-sectional views for illustrating a process of forming a plurality of LEDs. FIG. 4F to FIG. 4I are schematic cross-sectional views illustrating a process of forming a plurality of driving units DP. For convenience of explanation, FIG. 4A to FIG. 4E illustrate the first LED 150, the second LED 160 and the third LED 170 as in FIG. 3B, and FIG. 4F to FIG. 4I illustrate the first LED 150 and the driving unit DP of the first sub-pixel SP1, but a plurality of driving units DP can be formed in the second sub-pixel SP2 and the third sub-pixel SP3 in the same manner as the first sub-pixel SP1.

Figure 4A:
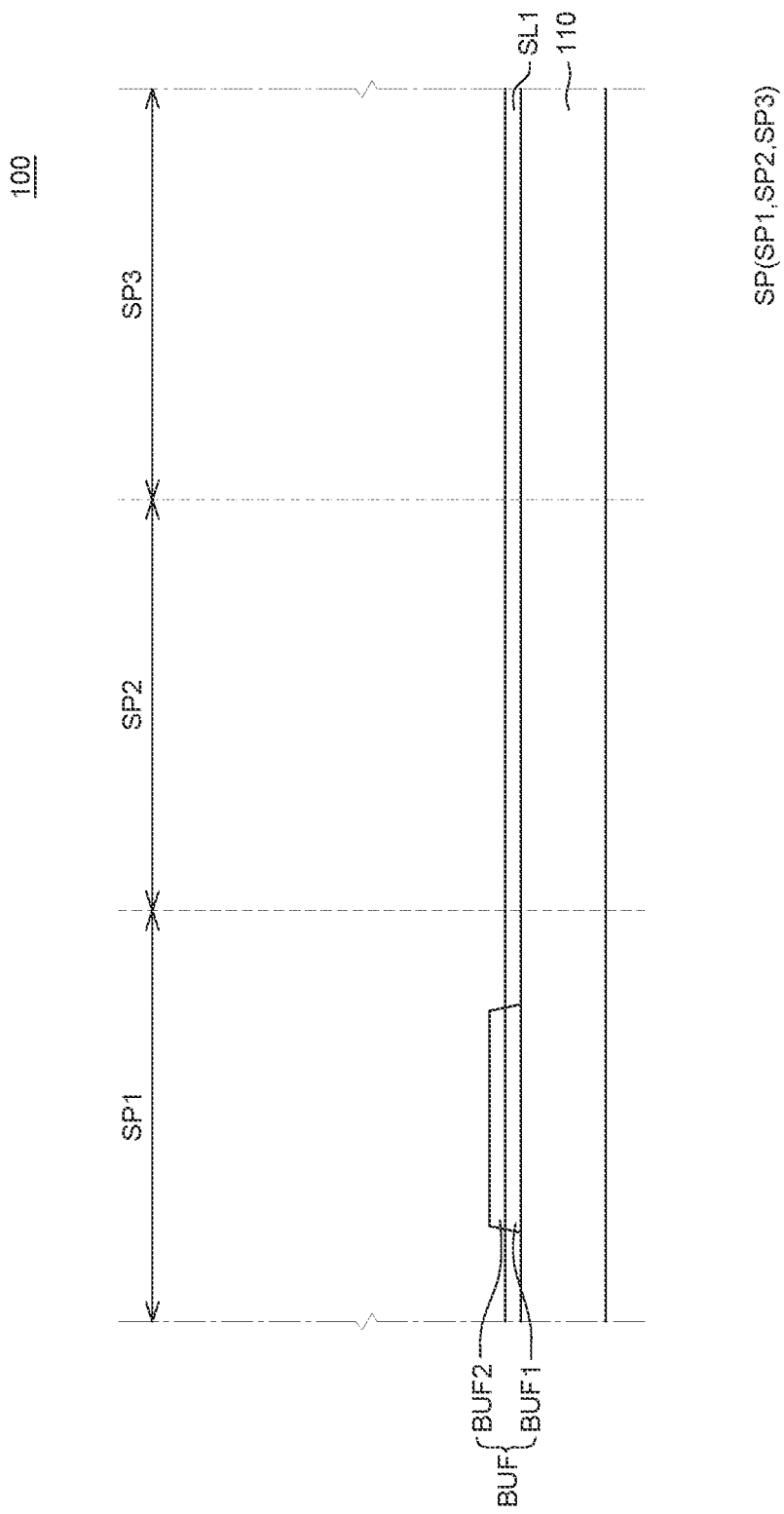

Referring to FIG. 4A, a first insulating layer SL1 that exposes an area where a plurality of first LEDs 150 are to be formed is formed on a substrate 110. The first insulating layer SL1 can be formed only in a remaining area other than the area where the plurality of first LEDs 150 are to be formed. For example, the first insulating layer SL1 can cover a part of an upper surface of the substrate 110 that overlaps an area where a plurality of driving units DP, a plurality of lines, a plurality of second LEDs 160 and a plurality of third LEDs 170 are to be formed.

In addition, a buffer layer BUF including a first buffer layer BUF1 and a second buffer layer BUF2 is formed in a partial area of the substrate 110 that is exposed from the first insulating layer SL1. The buffer layer BUF is a layer for reducing lattice mismatch between the plurality of first LEDs 150 and the substrate 110 as described above. When the plurality of first LEDs 150 are directly formed on the upper surface of the substrate 110 without the buffer layer BUF, it can be difficult to grow the plurality of first LEDs 150 due to a difference in lattice constants between the substrate 110 and the plurality of first LEDs 150. Accordingly, the buffer layer BUF can be first formed in the area where the plurality of first LEDs 150 are to be formed.

Figure 4B:
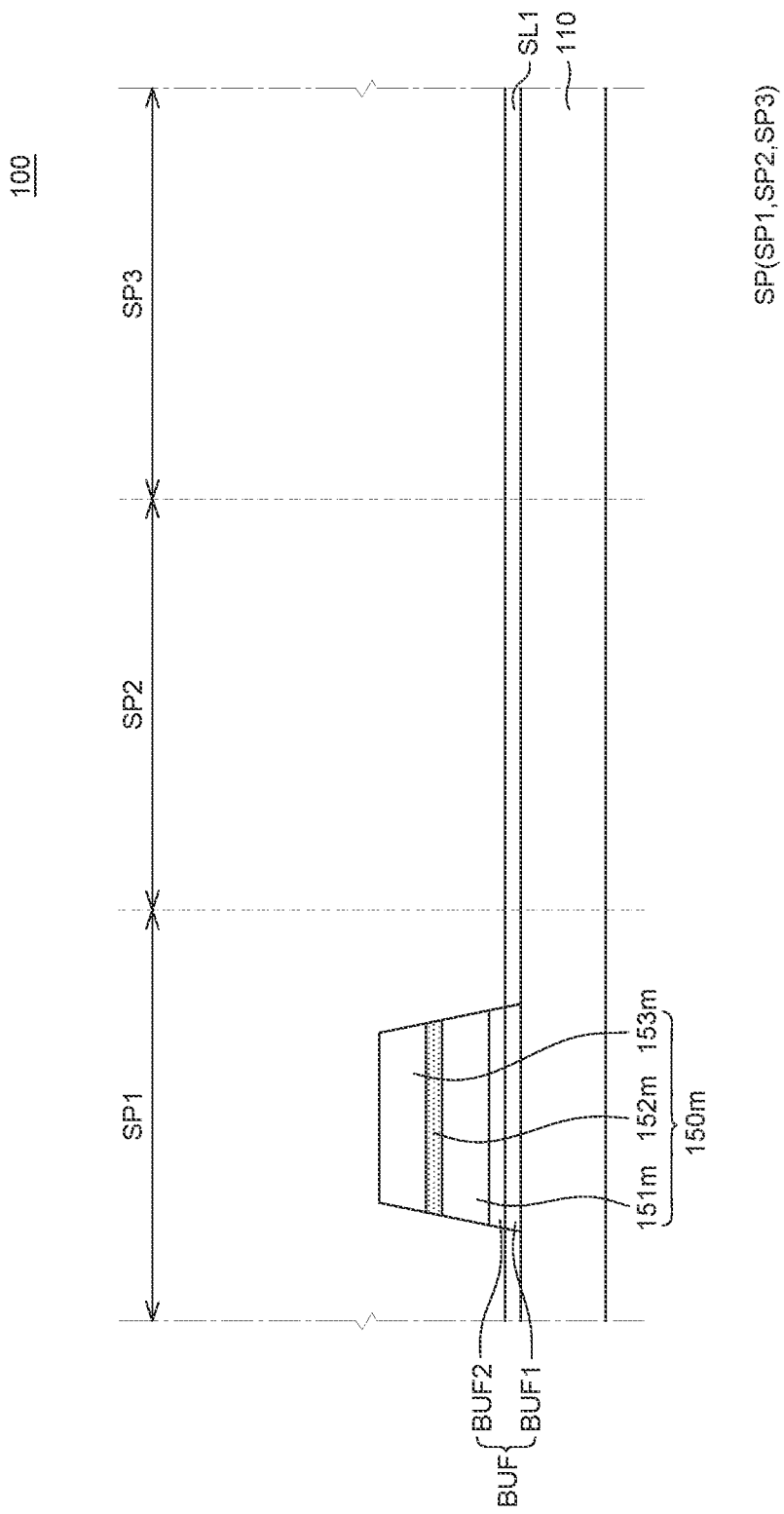

Referring to FIG. 4B, a first epitaxial layer 150m is formed on the buffer layer BUF. The first epitaxial layer 150m is for forming the plurality of first LEDs 150. The first epitaxial layer 150m can be a structure in which materials respectively forming a first n-type semiconductor layer 151, a first emission layer 152, and a first p-type semiconductor layer 153 of the plurality of first LEDs 150 are sequentially stacked. For example, the first epitaxial layer 150m can include a first n-type semiconductor material layer 151m, a first emission material layer 152m, and a first p-type semiconductor material layer 153m.

First, the first n-type semiconductor material layer 151m can be formed by growing a semiconductor crystal on the buffer layer BUF. In this case, a difference in lattice constant between the first n-type semiconductor material layer 151m and the substrate 110 can be greater than a difference in lattice constant between the buffer layer BUF and the first n-type semiconductor material layer 151m. In addition, lattice constants of the buffer layer BUF and the first n-type semiconductor material layer 151m can be similar to each other. Accordingly, in consideration of the lattice constants, the first n-type semiconductor material layer 151m is grown on the buffer layer BUF without directly growing the first n-type semiconductor material layer 151m on the substrate 110, whereby the first epitaxial layer 150m of good quality can be formed.

Subsequently, a semiconductor crystal can be grown on the first n-type semiconductor material layer 151m to form the first emission material layer 152m and the first p-type semiconductor material layer 153m. The first emission material layer 152m grown on the first n-type semiconductor material layer 151m can be grown by inheriting crystallinity of the first n-type semiconductor material layer 151m. The first p-type semiconductor material layer 153m grown on the first emission material layer 152m can be grown by inheriting crystallinity of the first emission material layer 152m.

The first n-type semiconductor material layer 151m, the first emission material layer 152m, and the first p-type semiconductor material layer 153m of the first epitaxial layer 150m can be grown on the substrate 110 by a method such as an organic metal chemical vapor deposition (MOCVD) or sputtering, but a growth method of the first epitaxial layer 150m is not limited thereto.

In this case, in the area where the first insulating layer SL1 is formed, the first epitaxial layer 150m may not be grown by the first insulating layer SL1, and the first epitaxial layer 150m can be grown only in the area where the buffer layer BUF is formed. Since the semiconductor crystal cannot be grown on the first insulating layer SL1, the first epitaxial layer 150m cannot be formed on the first insulating layer SL1. Accordingly, by adjusting the area where the first insulating layer SL1 is formed on the substrate 110, the first epitaxial layer 150m can be grown to correspond to the plurality of first LEDs 150.

Figure 4C:
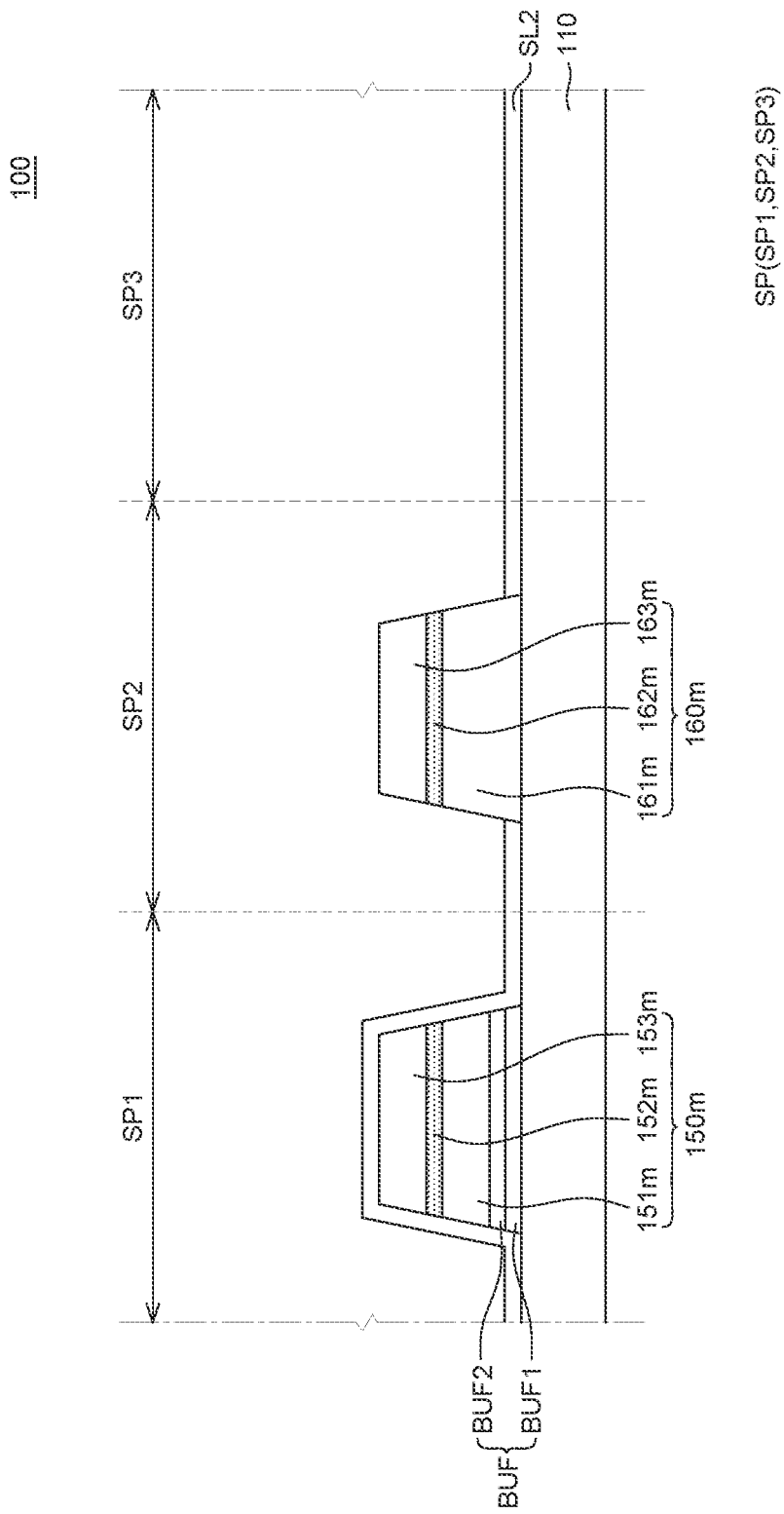

Referring to FIG. 4C, after the first insulating layer SL1 is removed, a second insulating layer SL2 that exposes an area where the plurality of second LEDs 160 are to be formed is formed on the substrate 110. The second insulating layer SL2 can be formed only in a remaining area other than the area where the plurality of second LEDs 160 are to be formed. For example, the second insulating layer SL2 can cover a part of the upper surface of the substrate 110 that overlaps an area where the plurality of driving units DP, a plurality of lines, the plurality of first LEDs 150, and the plurality of third LEDs 170 are to be formed, and the first epitaxial layer 150m.

Subsequently, a second epitaxial layer 160m is formed on the substrate 110 that is exposed from the second insulating layer SL2. The second epitaxial layer 160m is for forming the plurality of second LEDs 160. The second epitaxial layer 160m can be a structure in which materials respectively forming a second n-type semiconductor layer 161, a second emission layer 162, and a second p-type semiconductor layers 163 of the plurality of second LEDs 160 are sequentially stacked. For example, the second epitaxial layer 160m can include a second n-type semiconductor material layer 161m, a second emission material layer 162m, and a second p-type semiconductor material layer 163m.

In this case, unlike the first epitaxial layer 150m, since a lattice constant of the second n-type semiconductor material layer 161m which is first grown on the substrate 110, is similar to that of the substrate 110 formed of silicon. Therefore, the second n-type semiconductor material layer 161m can be grown directly on the substrate 110 without a separate buffer layer. For example, a difference in lattice constant between the second n-type semiconductor material layer 161m and the substrate 110 can be smaller than a difference in lattice constant between the first n-type semiconductor material layer 151m and the substrate 110. However, in order to minimize defects in the second epitaxial layer 160m, the second epitaxial layer 160m can be grown while a separate buffer layer is further formed, but is not limited thereto.

Figure 4D:
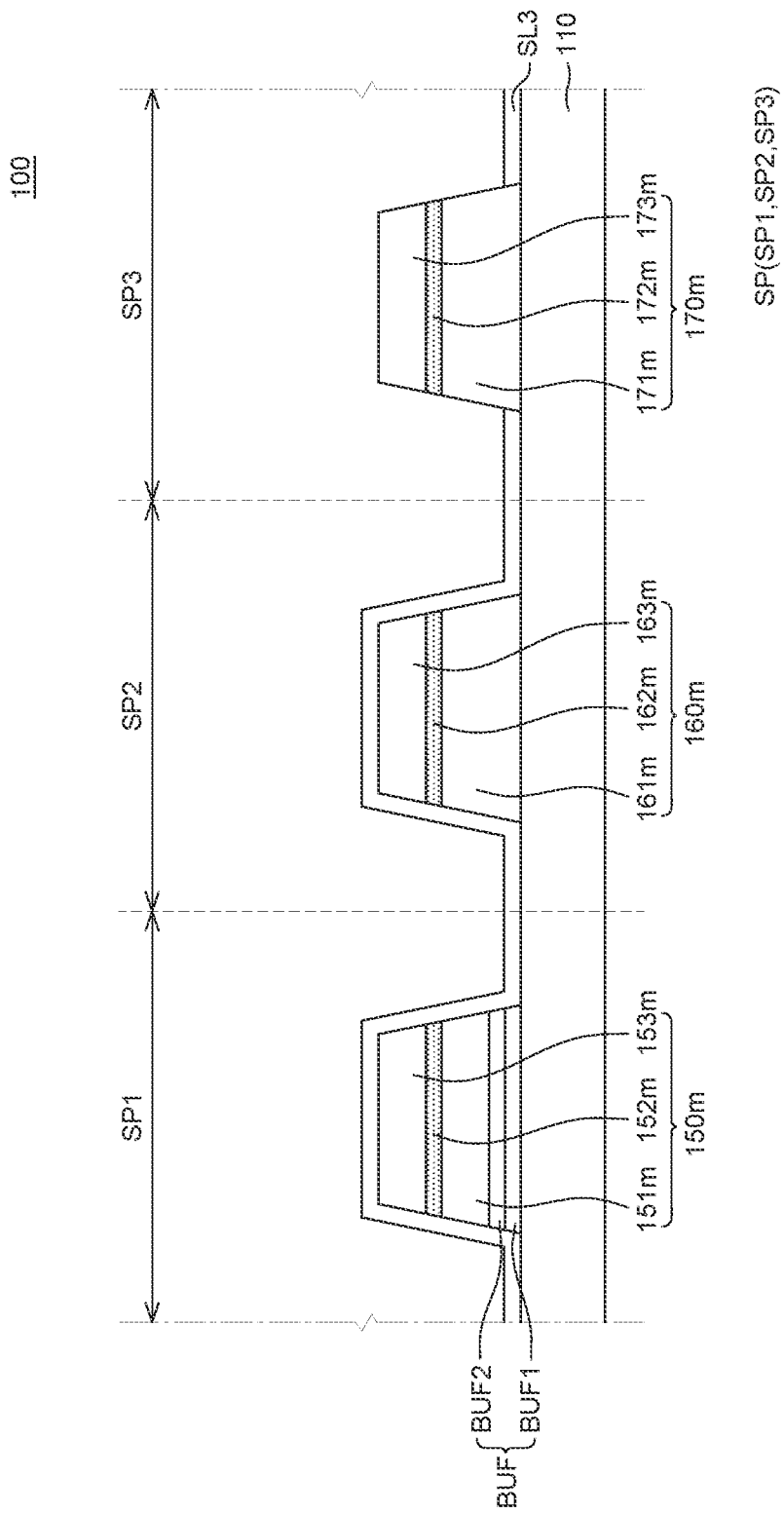

Referring to FIG. 4D, after the second insulating layer SL2 is removed, a third insulating layer SL3 that exposes an area where the plurality of third LEDs 170 are to be formed is formed on the substrate 110. The third insulating layer SL3 can be formed only in a remaining area other than the area where the plurality of third LEDs 170 are to be formed. For example, the third insulating layer SL3 can cover a part of the upper surface of the substrate 110 that overlaps an area where the plurality of driving units DP, a plurality of lines, the plurality of first LEDs 150, and the plurality of second LEDs 160 are to be formed, the first epitaxial layer 150m, and the second epitaxial layer 160m.

Subsequently, a third epitaxial layer 170m is formed on the substrate 110 that is exposed from the third insulating layer SL3. The third epitaxial layer 170m is for forming the plurality of third LEDs 170. The third epitaxial layer 170m can be a structure in which materials respectively forming a third n-type semiconductor layer 171, a third emission layer 172, and a third p-type semiconductor layer 173 of the plurality of third LEDs 170 are sequentially stacked. For example, the third epitaxial layer 170m can include a third n-type semiconductor material layer 171m, a third emission material layer 172m, and a third p-type semiconductor material layer 173m.

In this case, unlike the first epitaxial layer 150m, since a lattice constant of the third n-type semiconductor material layer 171m which is first grown on the substrate 110, is similar to that of the substrate 110 formed of silicon.

Therefore, the third n-type semiconductor material layer 171*m* can be grown directly on the substrate 110 without a separate buffer layer. For example, a difference in lattice constant between the third n-type semiconductor material layer 171*m* and the substrate 110 can be smaller than a difference in lattice constant between the first n-type semiconductor material layer 151*m* and the substrate 110. However, in order to minimize defects in the third epitaxial layer 170*m*, the third epitaxial layer 170*m* can be grown while a separate buffer layer is further formed, but is not limited thereto.

Figure 4E:
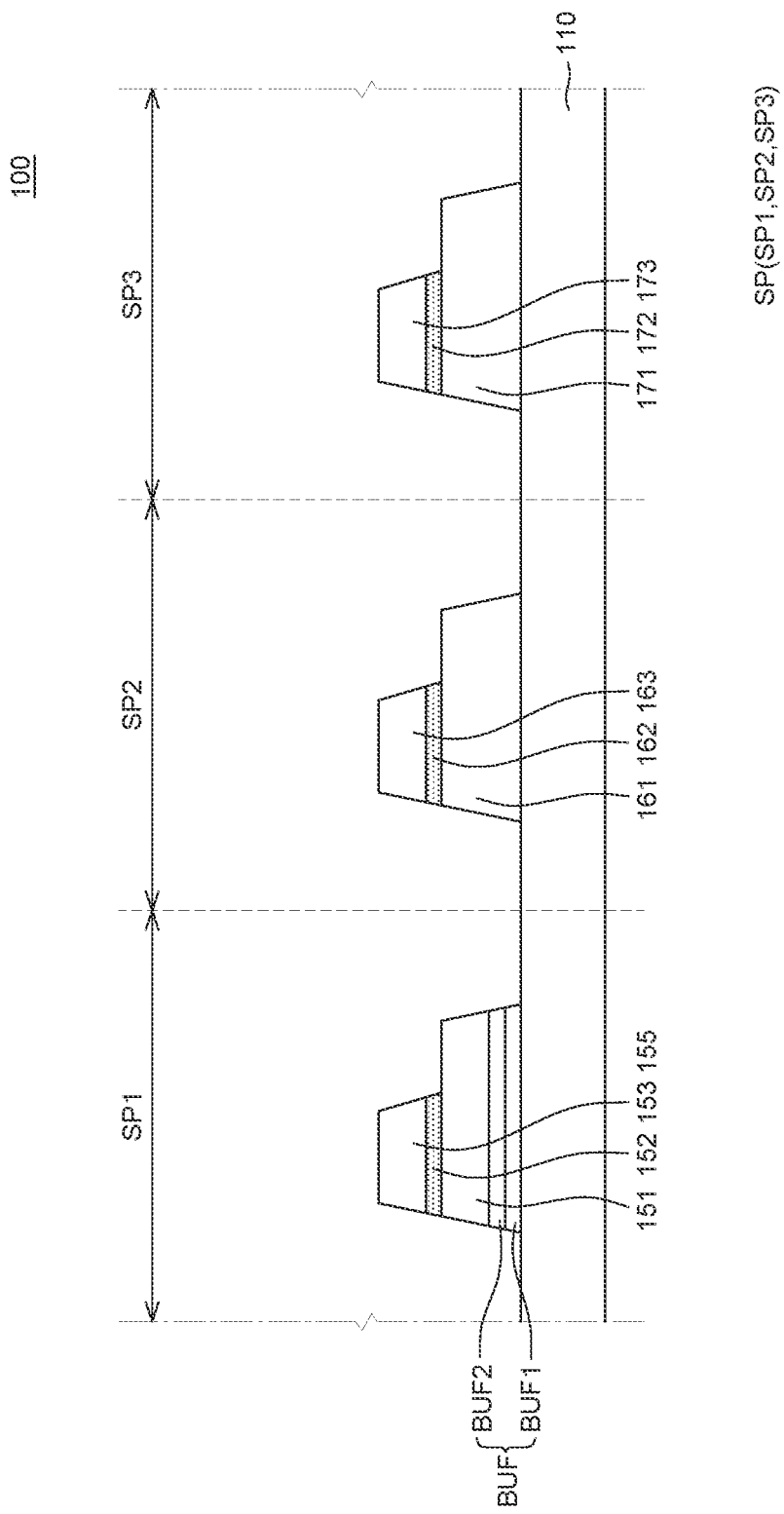

Referring to FIG. 4E, a portion of each of the first epitaxial layer 150*m*, the second epitaxial layer 160*m*, and the third epitaxial layer 170*m* is etched. A portion of the first epitaxial layer 150*m* can be etched to form the first n-type semiconductor layer 151, the first emission layer 152, and the first p-type semiconductor layer 153 of the first LED 150. A portion of the second epitaxial layer 160*m* can be etched to form the second n-type semiconductor layer 161, the second emission layer 162, and the second p-type semiconductor layer 163 of the second LED 160. A portion of the third epitaxial layer 170*m* can be etched to form the third n-type semiconductor layer 171, the third emission layer 172, and the third p-type semiconductor layer 173 of the third LED 170.

First, the first p-type semiconductor material layer 153*m* at an uppermost portion of the first epitaxial layer 150*m* can be etched. For example, the first p-type semiconductor material layer 153*m* can remain only in an area overlapping the first p-type semiconductor layer 153, and the first p-type semiconductor material layer 153*m* can be etched in an area other than the area overlapping the first p-type semiconductor layer 153. Thus, the first p-type semiconductor layer 153 formed of the first p-type semiconductor material layer 153*m* can be formed.

Subsequently, the first emission material layer 152*m* that is exposed from the first p-type semiconductor layer 153 can be etched. The first emission material layer 152*m* that overlaps the first p-type semiconductor layer 153 remains, and the first emission material layer 152*m* can be etched in an area other than an area overlapping the first p-type semiconductor layer 153. Thus, the first emission layer 152 formed of the first emission material layer 152*m* can be formed.

In addition, the first n-type semiconductor material layer 151*m* can be selectively etched. If the first epitaxial layer 150*m* is formed to have a larger size than the first LED 150, the first n-type semiconductor layer 151 of the first LED 150 can be formed by etching the first n-type semiconductor material layer 151*m*. If the first epitaxial layer 150*m* is formed to have the same size as the first LED 150, the first n-type semiconductor material layer 151*m* may not be etched.

Thus, the first epitaxial layer 150*m* can be partially etched to form the first p-type semiconductor layer 153 and the first emission layer 152, and the first n-type semiconductor layer 151 of which a portion is exposed from the first p-type semiconductor layer 153 and the first emission layer 152.

The second epitaxial layer 160*m* and the third epitaxial layer 170*m* can also be partially etched in the same manner as the first epitaxial layer 150*m*. The second p-type semiconductor layer 163 and the second emission layer 162 can be formed by etching the second p-type semiconductor material layer 163*m* and the second emission material layer 162*m* of the second epitaxial layer 160*m*. In addition, the second n-type semiconductor layer 161 can be formed by selectively etching the second n-type semiconductor material layer 161*m* according to a design. Thus, the second epitaxial layer 160*m* can be partially etched to form the second p-type semiconductor layer 163 and the second emission layer 162, and the second n-type semiconductor layer 161 of which a portion is exposed from the second p-type semiconductor layer 163 and the second emission layer 162.

The third p-type semiconductor layer 173 and the third emission layer 172 can be formed by etching the third p-type semiconductor material layer 173*m* and the third emission material layer 172*m* of the third epitaxial layer 170*m*. In addition, the third n-type semiconductor layer 171 can be formed by selectively etching the third n-type semiconductor material layer 171*m* according to a design. Thus, the third epitaxial layer 170*m* can be partially etched to form the third p-type semiconductor layer 173 and the third emission layer 172, and the third n-type semiconductor layer 171 of which a portion is exposed from the third p-type semiconductor layer 173 and the third emission layer 172.

Figure 4F:
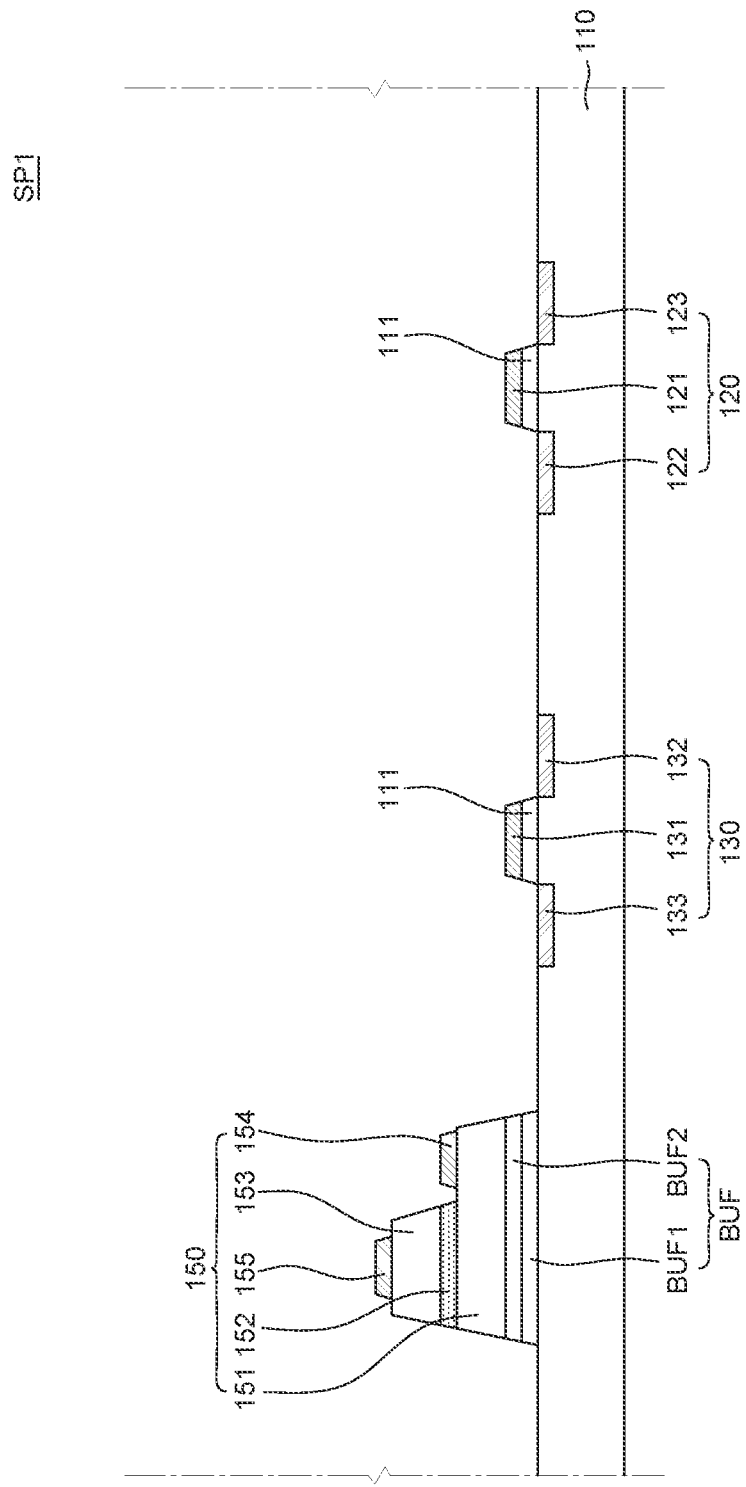

Referring to FIG. 4F, a gate insulating layer 111 and gate electrodes 121 and 131 are formed on the substrate 110.

First, a material forming the gate insulating layer 111 and materials forming the gate electrodes 121 and 131 that cover the first n-type semiconductor layer 151, the first emission layer 152, and the first p-type semiconductor layer 153 of the first LED 150, the second n-type semiconductor layer 161, the second emission layer 162 and the second p-type semiconductor layer 163 of the second LED 160, and the third n-type semiconductor layer 171, the third emission layer 172 and the third p-type semiconductor layer 173 of the third LED 170, can be sequentially formed on an entire surface of the substrate 110. In addition, the first gate electrode 121, the second gate electrode 131, and the gate insulating layer 111 can be formed by etching the material forming the gate insulating layer 111 and materials forming the gate electrodes 121 and 131.

In addition, source regions 122 and 132 and drain regions 123 and 133 of the plurality of respective transistors 120 and 130 are formed. Specifically, a first source region 122 and a first drain region 123 of the first transistor 120 and a second source region 132 and a second drain region 133 of the second transistor 130 can be formed.

Specifically, a photoresist can be formed in an area except for areas overlapping the first source region 122, the first drain region 123, the second source region 132, and the second drain region 133. In addition, an impurity having a polarity opposite to that of the substrate 110, for example, any one of an n-type impurity or a p-type impurity, can be doped into a partial area of the substrate 110 that is exposed from the photoresist. In addition, after doping of the n-type impurity or the p-type impurity, an annealing process can be performed for electrical activation. Therefore, the first source region 122, the first drain region 123, the second source region 132, and the second drain region 133 can be formed by doping an n-type impurity or a p-type impurity only in a partial area of the substrate 110 using a photoresist.

Accordingly, it is possible to complete forming the first transistor 120 formed of the first gate electrode 121, the first source region 122, and the first drain region 123 and the second transistor 130 formed of the second gate electrode 131, the second source region 132, and the second drain region 133.

However, after forming the first source region 122, the first drain region 123, the second source region 132, and the second drain region 133 first, the first gate electrode 121, the second gate electrode 131, and the gate insulating layer 111 can be formed, and a process order is not limited thereto.

In addition, n-type electrodes 154, 164, 174 and p-type electrodes 155, 165, 175 of the plurality of respective LEDs are formed. Specifically, a first n-type electrode 154 can be formed on an upper surface of the first n-type semiconductor layer 151 of each of the plurality of first LEDs 150, and a first p-type electrode 155 can be formed on an upper surface of the first p-type semiconductor layer 153. A second n-type electrode 164 can be formed on an upper surface of the second n-type semiconductor layer 161 of each of the plurality of second LEDs 160, and a second p-type electrode 165 can be formed on an upper surface of the second p-type semiconductor layer 163. A third n-type electrode 174 can be formed on an upper surface of the third n-type semiconductor layer 171 of each of the plurality of third LEDs 170, and a third p-type electrode 175 can be formed on an upper surface of the third p-type semiconductor layer 173. At this time, the n-type electrodes 154, 164, 174 and p-type electrodes 155, 165, 175 of the plurality of respective LEDs can be formed before or after, or simultaneously with the formation of the first transistor 120 and the second transistor 130.

Figure 4G:
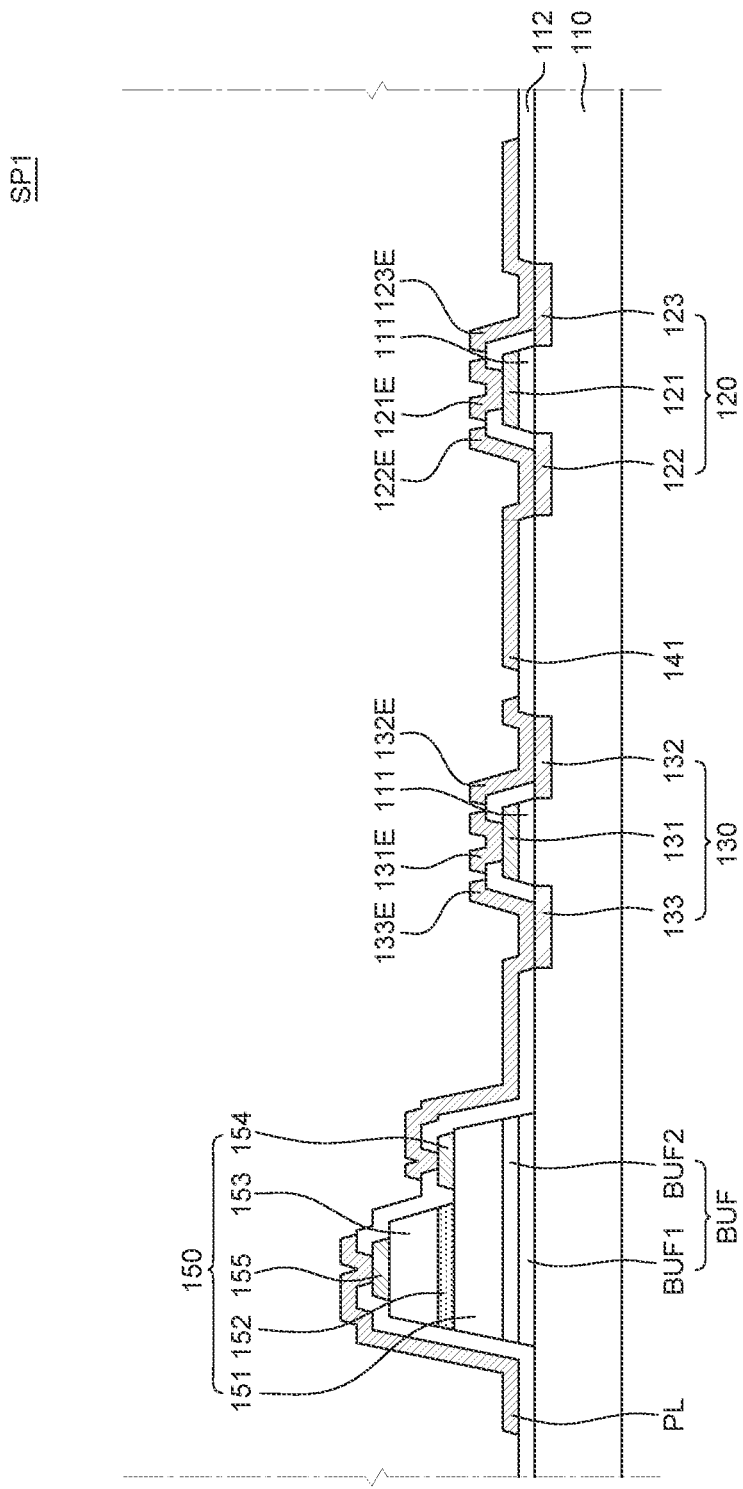

Next, referring to FIG. 4G, a first passivation layer 112 that covers the plurality of LEDs, the first transistor 120 and the second transistor 130 is formed.

Specifically, a material forming the first passivation layer 112 can be formed on the first LED 150, the second LED 160, the third LED 170, the first transistor 120, and the second transistor 130. In addition, contact holes that expose the first n-type electrode 154 and the first p-type electrode 155 of the first LED 150, contact holes that expose the second n-type electrode 164 and the second p-type electrode 165 of the second LED 160, contact holes that expose the third n-type electrode 174 and the third p-type electrode 175 of the third LED 170, contact holes that expose the first gate electrode 121, the first source region 122 and the first drain region 123 of the first transistor 120, and contact holes that expose the second gate electrode 131, the second source region 132 and the second drain region 133 of the second transistor 130 can be formed in the material forming the first passivation layer 112. Accordingly, contact holes that expose portions of the plurality of LEDs, portions of the first transistor 120, and portions of the second transistor 130 can be formed in the material forming the first passivation layer 112 to thereby form the first passivation layer 112.

Subsequently, a first gate connection electrode 121E, a first source connection electrode 122E, a first drain connection electrode 123E, a second gate connection electrode 131E, a second source connection electrode 132E, a second drain connection electrode 133E, a first capacitor electrode 141, a plurality of gate lines GL, and a plurality of power lines PL are formed on the first passivation layer 112.

Specifically, a conductive material layer can be formed on the first passivation layer 112. The conductive material layer is etched, whereby the first gate connection electrode 121E, the first source connection electrode 122E, the first drain connection electrode 123E, the second gate connection electrode 131E, the second source connection electrode 132E, the second drain connection electrode 133E, the first capacitor electrode 141, the plurality of gate lines GL, and the plurality of power lines PL can be formed.

In this case, the gate lines GL and the first gate connection electrode 121E that are formed of the same conductive material layer are formed integrally and can be electrically connected to each other. The second gate connection electrode 131E, the first source connection electrode 122E, and the first capacitor electrode 141 that are formed of the same conductive material are also formed integrally and can be electrically connected to the second gate electrode 131, the first source region 122, and the first capacitor electrode 141.

In addition, portions of the power lines PL are formed to fill the contact holes that expose the p-type electrodes 155, 165, and 175 of the plurality of respective LEDs, and can be electrically connected to the plurality of LEDs. The second drain connection electrode 133E is formed to fill the contact hole that exposes the n-type electrode 154, 164 or 174 of each of the plurality of LEDs and can be electrically connected to each of the plurality of LEDs.

Figure 4H:
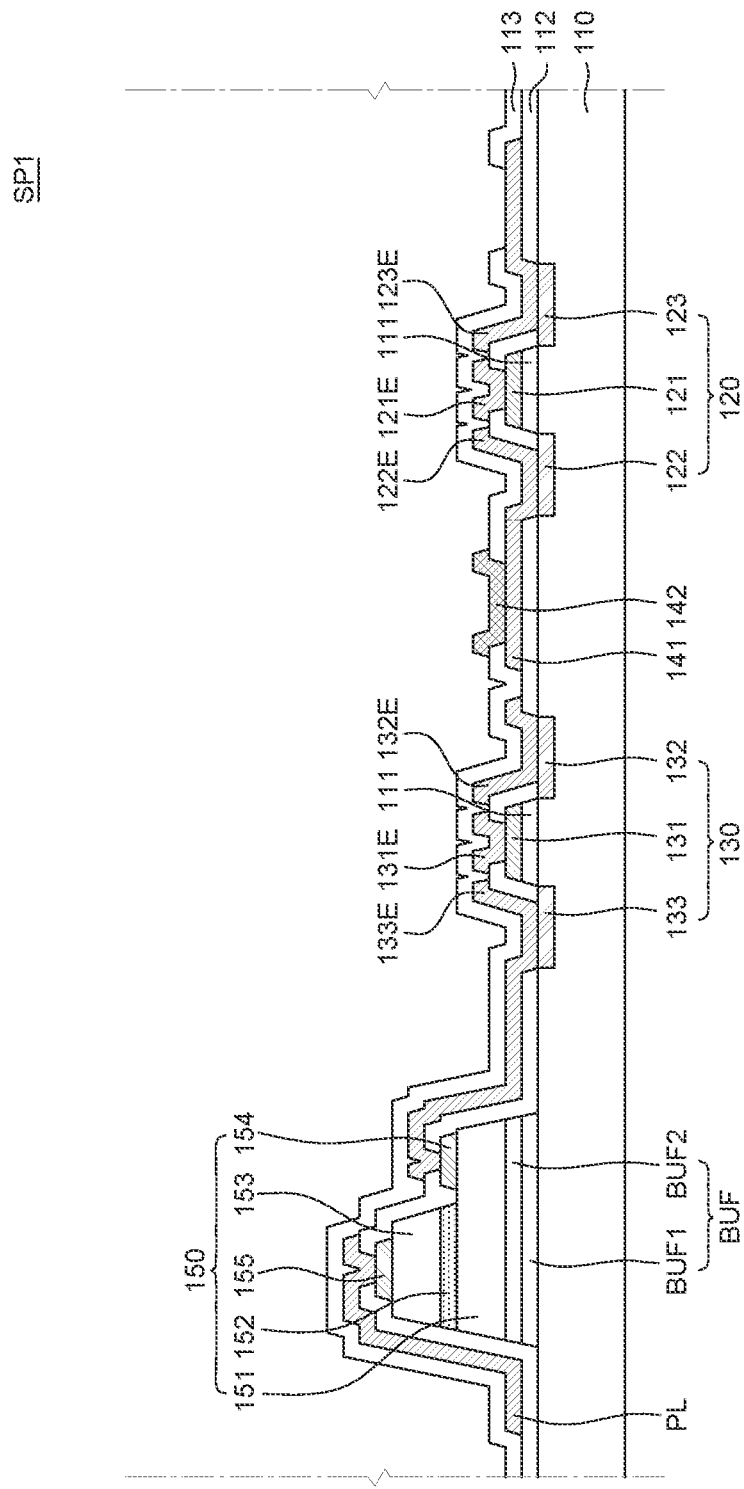
Figure 41:
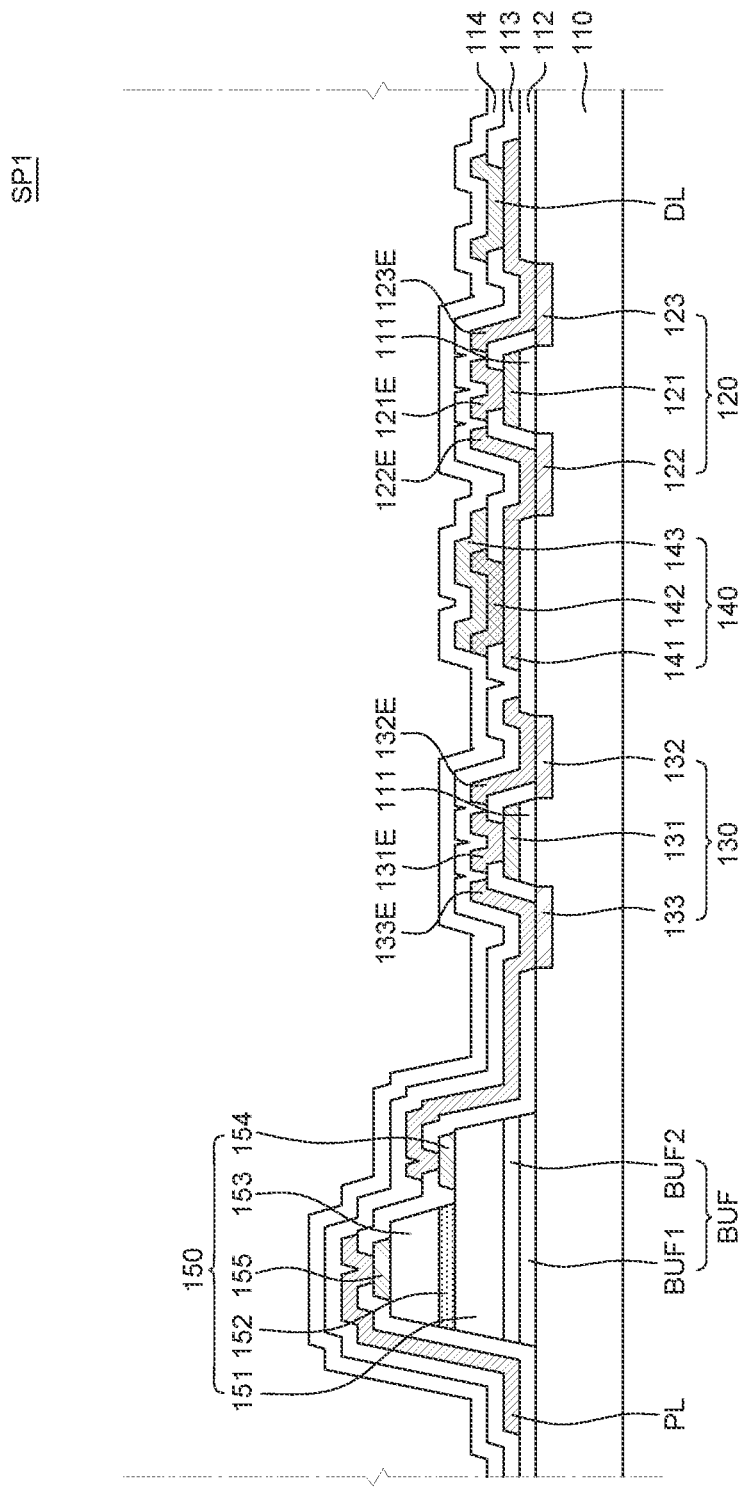

Referring to FIG. 4H, a second passivation layer 113 and a dielectric layer 142 are formed on the plurality of LEDs, the first gate connection electrode 121E, the first source connection electrode 122E, the first drain connection electrode 123E, the second gate connection electrode 131E, the second source connection electrode 132E, the second drain connection electrode 133E, the first capacitor electrode 141, the plurality of gate lines GL, and the plurality of power lines PL.

Specifically, a material forming the second passivation layer 113 can be formed on the plurality of LEDs, the first gate connection electrode 121E, the first source connection electrode 122E, the first drain connection electrode 123E, the second gate connection electrode 131E, the second source connection electrode 132E, the second drain connection electrode 133E, the first capacitor electrode 141, the plurality of gate lines GL, and the plurality of power lines PL. And, contact holes that expose the first drain connection electrode 123E, the second source connection electrode 132E, and the first capacitor electrode 141 can be formed in the material forming the second passivation layer 113. Thus, contact holes that expose portions of the first capacitor electrode 141, portions of the first transistor 120, and portions of the second transistor 130 can be formed in the material forming the second passivation layer 113 to thereby form the second passivation layer 113.

Subsequently, the dielectric layer 142 can be formed in the contact hole that exposes the first capacitor electrode 141 among the contact holes of the second passivation layer 113. The dielectric layer 142 can be formed to cover the first capacitor electrode 141.

Finally, referring to FIG. 4I, a second capacitor electrode 143, a data line DL, a common line CL, and a third passivation layer 114 are formed on the second passivation layer 113 and the dielectric layer 142.

Specifically, a conductive material layer can be formed on the second passivation layer 113 and the dielectric layer 142. In addition, the data line DL, the common line CL, and the second capacitor electrode 143 can be formed by etching the conductive material layer.

In this case, the data line DL can contact the first drain connection electrode 123E through a contact hole formed in the second passivation layer 113, and the data line DL can be electrically connected to the first drain region 123 of the first transistor 120. The common line CL can contact the second source connection electrode 132E through a contact hole formed in the second passivation layer 113, and the common line CL can be electrically connected to the second source region 132 of the second transistor 130. In addition, the second capacitor electrode 143 and the common line CL that are formed from the same conductive material layer are formed integrally, and the second capacitor electrode 143 and the common line CL can be electrically connected.

Finally, a third passivation layer 114 can be formed on the entire surface of the substrate 110 on the data line DL, the common line CL, and the second capacitor electrode 143.

In the display device 100 and the method of manufacturing the display device 100 according to an exemplary embodiment of the present disclosure, the plurality of first LEDs 150, the plurality of second LEDs 160, and the plurality of third LEDs 170 are grown on one substrate 110 using the buffer layer BUF, and the plurality of driving units DP and the plurality of lines are formed directly on the substrate 110, so that the plurality of LEDs can be formed on the display device 100 in a non-transfer method. First, since the second LED 160 and the third LED 170 have high growth efficiency on the substrate 110 formed of silicon, the second epitaxial layer 160m and the third epitaxial layer 170m are grown directly on the substrate 110, so that the second LED 160 and the third LED 170 can be formed. Since the first LED 150 has low growth efficiency on the silicon substrate 110, a buffer layer BUF including a first buffer layer BUF1 and a second buffer layer BUF2 for matching of lattice constants is formed on the substrate 110, and then, the first epitaxial layer 150m can be grown on the buffer layer BUF to form the first LED 150. Accordingly, the plurality of LEDs can be grown on one substrate 110. In addition, the plurality of driving units DP including the first transistor 120, the second transistor 130, and the storage capacitor 140, and the plurality of lines including the gate line GL, the data line DL, the common line CL, the power line PL, and the like can be directly formed on the substrate 110 on which the plurality of LEDs are formed. Accordingly, a process of transferring the plurality of LEDs to the substrate 110 on which the plurality of driving units DP and the plurality of lines are formed can be omitted, and alignments between the plurality of LEDs and the plurality of driving units DP and the plurality of lines can be facilitated. Thus, since the display device 100 can be formed in a non-transfer method, a process time can be shortened and defects due to an alignment error can be minimized to allow for improvements in a yield.

Figure 5:
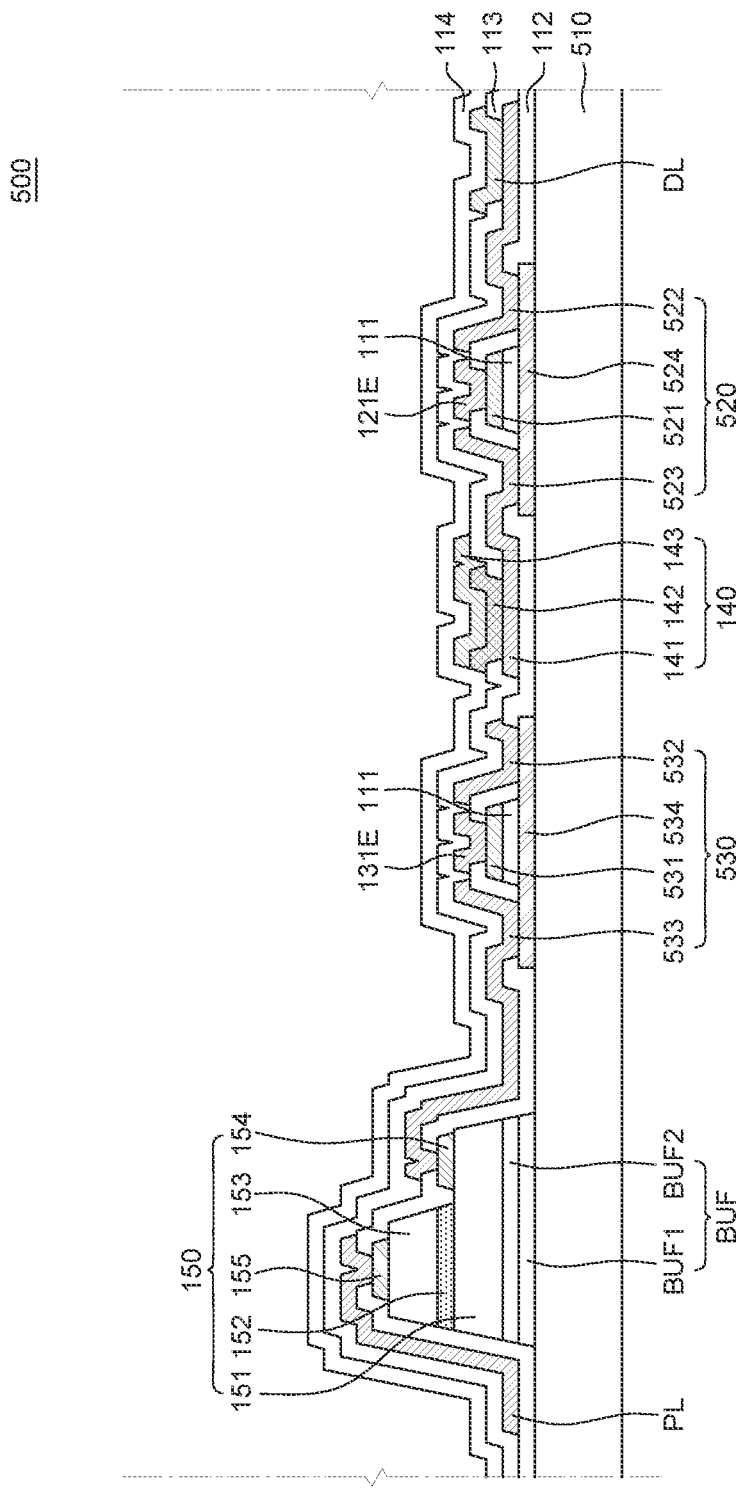
FIG. 5 is a cross-sectional view of a display device according to another exemplary embodiment of the present disclosure.

FIG. 5 is a cross-sectional view of a display device according to another exemplary embodiment of the present disclosure. Since a display device 500 of FIG. 5 differs from the display device 100 of FIG. 1 to FIG. 3B in terms of a substrate 510, a buffer layer BUF, and a plurality of transistors 520 and 530, but other configurations of the display device 500 of FIG. 5 are substantially identical to those of the display device 100 of FIG. 1 to FIG. 3B, a redundant description will be omitted or may be briefly provided.

Referring to FIG. 5, the substrate 510 can be formed of sapphire. In addition, as the substrate 510 is formed of sapphire, the buffer layer BUF for forming the plurality of first LEDs 150 and the plurality of transistors 520 and 530 can be configured differently.

Specifically, the buffer layer BUF is a layer for reducing a difference in lattice constants between the substrate 510 and the first epitaxial layer 150m for forming the plurality of first LEDs 150. The buffer layer BUF can be formed of various materials according to a type of the substrate 510 and an epitaxial layer material for forming the plurality of LEDs. For example, when the substrate 510 is a sapphire substrate 510, the buffer layer BUF can be a structure in which a first buffer layer BUF1 formed of graphene and a second buffer layer BUF2 formed of n-type gallium arsenide (n-GaAs) are stacked, but is not limited thereto.

Meanwhile, when the substrate 510 is the sapphire substrate 510, the transistors 520 and 530 of the plurality of driving units DP can be formed of thin film transistors instead of field effect transistors.

The first transistor 520 includes a first gate electrode 521, a first active layer 524, a first source electrode 522, and a first drain electrode 523.

First, the first active layer 524 is disposed on the substrate 510. The first active layer 524 can be formed of a semiconductor material such as an oxide semiconductor, amorphous silicon, or polysilicon, but is not limited thereto.

The gate insulating layer 111 is disposed on the first active layer 524, and the first gate electrode 521 is disposed on the gate insulating layer 111. The first gate electrode 521 is disposed to overlap the first active layer 524 and can be electrically connected to the gate line GL. The first gate electrode 521 can be formed of, for example, a conductive material such as polysilicon or molybdenum (Mo), but is not limited thereto.

The first passivation layer 112 is disposed on the first active layer 524 and the first gate electrode 521, and the first source electrode 522 and the first drain electrode 523 that are spaced apart from each other are disposed on the first passivation layer 112. The first source electrode 522 can be electrically connected to the first active layer 524 through a contact hole formed in the first passivation layer 112. The first source electrode 522 can be integrally formed with the first capacitor electrode 141 and can be electrically connected to the storage capacitor 140. In addition, the first source electrode 522 can extend toward a second gate electrode 531 and can be electrically connected to the second gate connection electrode 131E and the second gate electrode 531 through a contact hole formed in the first passivation layer 112.

The first drain electrode 523 can be electrically connected to the first active layer 524 through a contact hole formed in the first passivation layer 112. In addition, the first drain electrode 523 can be electrically connected to the data line DL through a contact hole formed in the second passivation layer 113. The first source electrode 522 and the first drain electrode 523 can be configured of a conductive material, for example, copper (Cu), aluminum (Al), molybdenum (Mo), nickel (Ni), titanium (Ti), chromium (Cr) or an alloy thereof, but is not limited thereto.

The second transistor 530 includes the second gate electrode 531, a second active layer 534, a second source electrode 532, and a second drain electrode 533.

The second active layer 534 is disposed on the substrate 510. The second active layer 534 can be formed of a semiconductor material such as an oxide semiconductor, amorphous silicon, or polysilicon, but is not limited thereto.

The gate insulating layer 111 is disposed on the second active layer 534, and the second gate electrode 531 is disposed on the gate insulating layer 111. The second gate electrode 531 is disposed to overlap the second active layer 534 and can be electrically connected to the first source electrode 522. The first gate electrode 521 can be formed of, for example, a conductive material such as polysilicon or molybdenum (Mo), but is not limited thereto.

The first passivation layer 112 is disposed on the second active layer 534 and the second gate electrode 531. The second source electrode 532 and the second drain electrode 533 that are spaced apart from each other are disposed on the first passivation layer 112. The second source electrode 532 can be electrically connected to the second active layer 534 through a contact hole formed in the first passivation layer 112. The second source electrode 532 can be electrically connected to the common line CL that is formed integrally with the second capacitor electrode 143. The second drain electrode 533 can be electrically connected to the second active layer 534 through a contact hole formed in the first passivation layer 112. The second drain electrode 533 extends toward each of the plurality of LEDs and can be electrically connected to the n-type electrode 154, 164 or 174 of each of the plurality of LEDs. The second source electrode 532 and the second drain electrode 533 can be configured of a conductive material, for example, copper (Cu), aluminum (Al), molybdenum (Mo), nickel (Ni), titanium (Ti), chromium (Cr) or an alloy thereof, but is not limited thereto.

Meanwhile, in FIG. 5, the plurality of transistors 520 and 530 are illustrated as having a structure in which the gate electrodes 521 and 531 are formed above the active layers 524 and 534, respectively, but the structure of the transistors 520 and 530 is not limited thereto.

In the display device 500 according to another exemplary embodiment of the present disclosure, the buffer layer BUF and the plurality of transistors 520 and 530 can be variously designed according to the type of the substrate 510. For example, when the substrate is a silicon substrate, field effect transistors formed by doping impurities into the substrate can be used as the plurality of transistors, and the first LED can be formed by configuring the buffer layer with germanium and n-type gallium arsenide. On the other hand, when the substrate 510 is the sapphire substrate 510 as in the display device 500 according to another exemplary embodiment of the present disclosure, thin film transistors including the active layers 524 and 534, the gate electrodes 521 and 531, source electrodes 522 and 532, and drain electrodes 523 and 533 can be used as the plurality of transistors 520 and 530, and the first LED 150 can be formed by configuring the buffer layer BUF with graphene and n-type gallium arsenide. Accordingly, in the display device 500 according to another exemplary embodiment of the present disclosure, the type of the substrate 510 is not limited, and the plurality of LEDs and the plurality of driving units DP can be formed together on the substrate 510, so that a design freedom degree can be improved.

Figure 6:
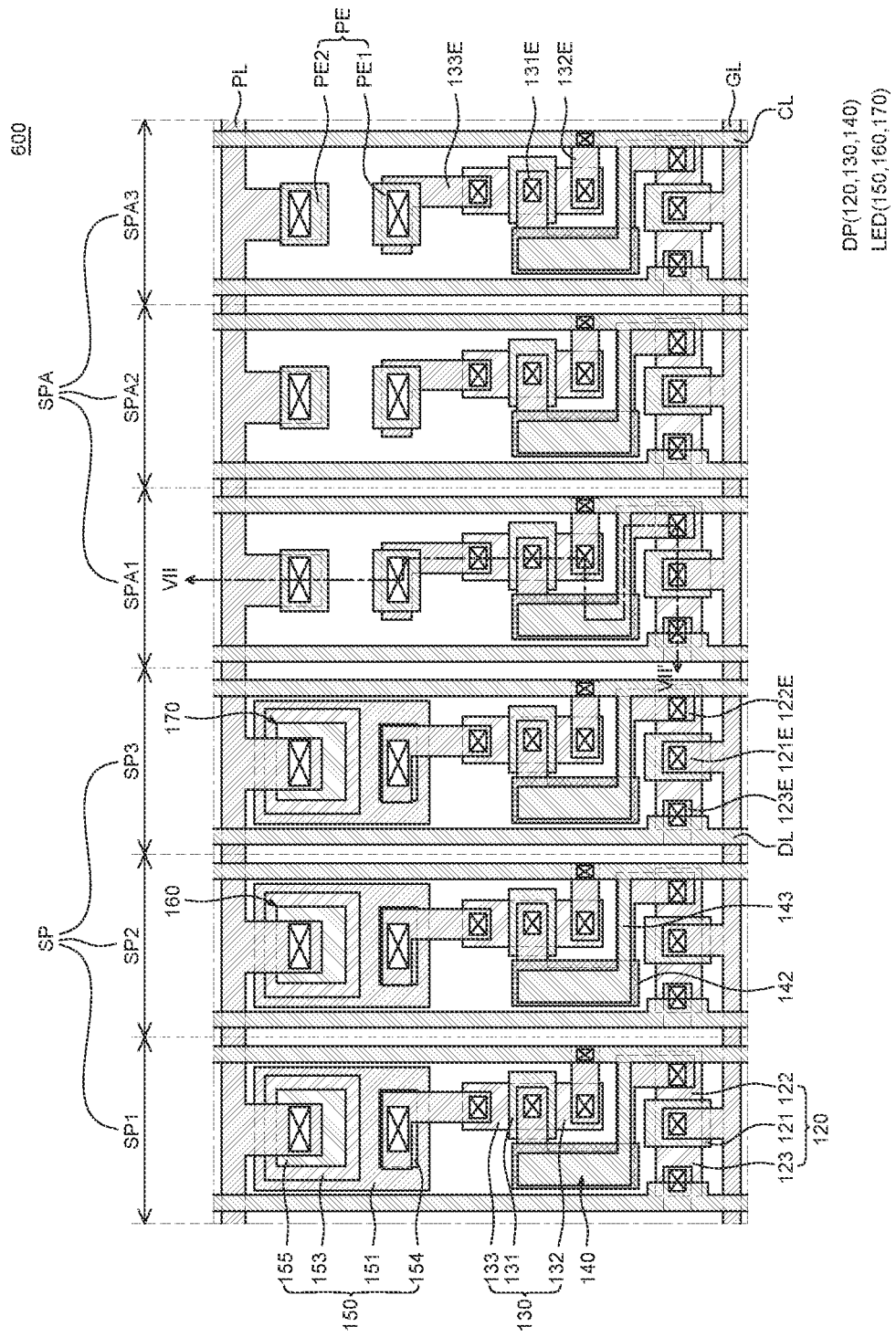
FIG. 6 is an enlarged plan view of the display device according to another exemplary embodiment of the present disclosure.
Figure 7:
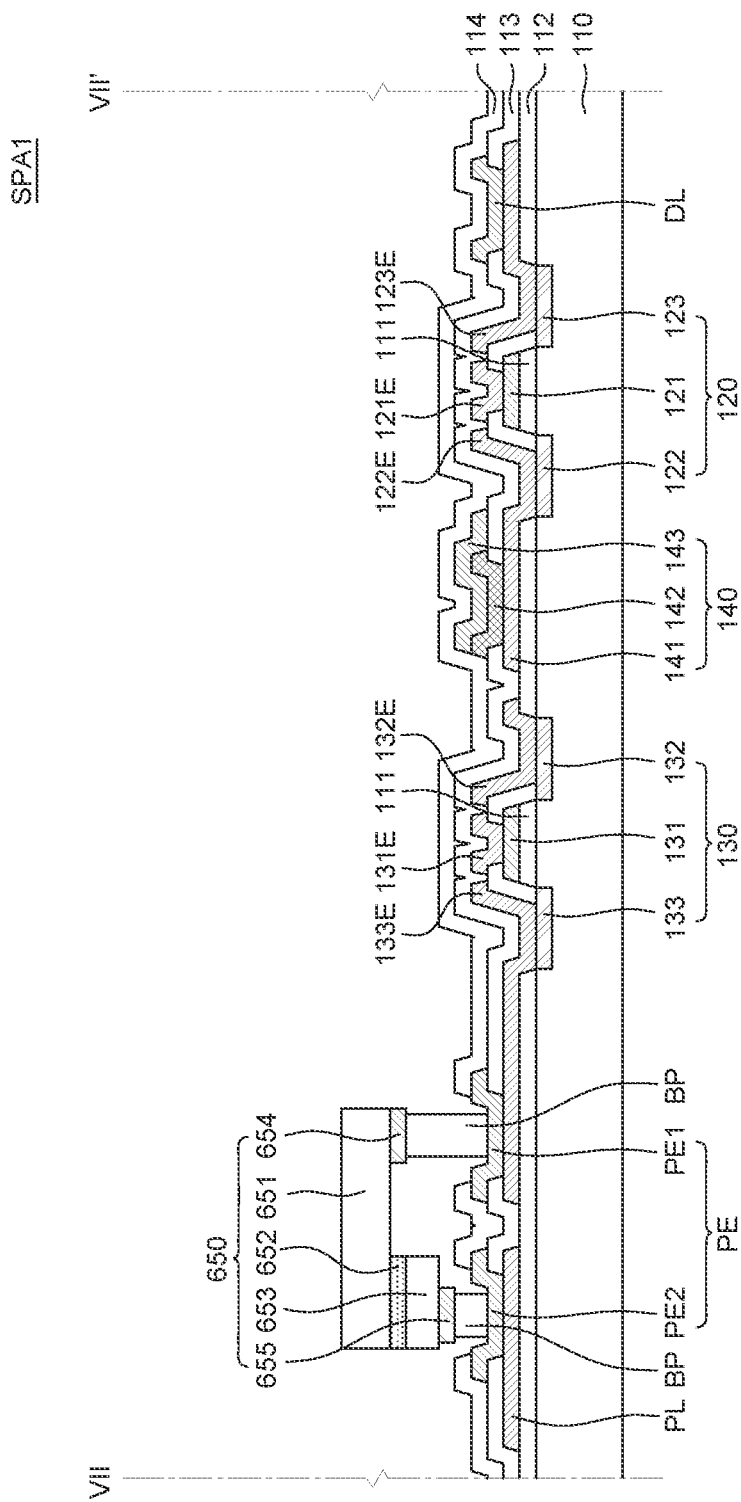
FIG. 7 is a cross-sectional view taken along line VII-VII' of FIG. 6.

FIG. 6 is an enlarged plan view of a display device according to another exemplary embodiment of the present disclosure. FIG. 7 is a cross-sectional view taken along line VII-VII' of FIG. 6.

Particularly, FIG. 7 is a cross-sectional view illustrating an exemplary case in which a first auxiliary LED 650 is transferred to a first auxiliary sub-pixel SPA1 when the first sub-pixel SP1 is defective. Since other configurations of a display device 600 of FIGS. 6 and 7 are substantially identical to those of the display device 100 of FIG. 1 to FIG. 3B except that the display device 600 of FIGS. 6 and 7 further includes a plurality of auxiliary sub-pixels SPA and a plurality of auxiliary LEDs, a redundant description will be omitted or may be briefly provided.

Referring to FIGS. 6 and 7, a plurality of sub-pixels SP and a plurality of auxiliary sub-pixels SPA are defined on the substrate 110. The plurality of auxiliary sub-pixels SPA are sub-pixels for compensating defective sub-pixels SP when the defective sub-pixels SP occur. The plurality of auxiliary sub-pixels SPA includes a first auxiliary sub-pixel SPA1, a second auxiliary sub-pixel SPA2, and a third auxiliary sub-pixel SPA3. The first auxiliary sub-pixel SPA1 can display red light instead of the first sub-pixel SP1 in which a defect occurs, the second auxiliary sub-pixel SPA2 can display green light instead of the second sub-pixel SP2 in which a defect occurs, and the third auxiliary sub-pixel SPA3 can display blue light instead of the third sub-pixel SP3 in which a defect occurs.

The auxiliary LEDs are disposed in at least one of the plurality of auxiliary sub-pixels SPA. The auxiliary LEDs are LEDs for replacing a plurality of LEDs when the plurality of LEDs are defective, and include a first auxiliary LED 650, a second auxiliary LED, and a third auxiliary LED. The auxiliary LEDs can be transferred to the plurality of auxiliary sub-pixels SPA when any one of the plurality of LEDs is defective. For example, when the first LED 150 of the first sub-pixel SP1 is defective, the first auxiliary LED 650 is disposed in the first auxiliary sub-pixel SPA1 and can display red light instead of the first LED 150. When the second LED 160 of the second sub-pixel SP2 is defective, the second auxiliary LED is disposed in the second auxiliary sub-pixel SPA2 and can display green light instead of the second LED 160. When the third LED 170 of the third sub-pixel SP3 is defective, the third auxiliary LED is disposed in the third auxiliary sub-pixel SPA3 and can display blue light instead of the third LED 170.

In addition, the plurality of auxiliary LEDs may not be disposed on the entirety of the plurality of auxiliary sub-pixels SPA, and can be selectively disposed in consideration of defective sub-pixels SP. For example, when only the first sub-pixel SP1 among the plurality of sub-pixels SP is defective, the first auxiliary LED 650 can be disposed only in the first auxiliary sub-pixel SPA1 among the plurality of auxiliary sub-pixels SPA. When all of the plurality of sub-pixels SP are normal, the auxiliary LED may not be disposed in the plurality of auxiliary sub-pixels SPA. When the first sub-pixel SP1 and the second sub-pixel SP2 among the plurality of sub-pixels SP are defective, the first auxiliary LED 650 and the second auxiliary LED can be disposed only in the first auxiliary sub-pixel SPA1 and the second auxiliary sub-pixel SPA2, respectively.

The plurality of driving units DP including the first transistor 120, the second transistor 130, and the storage capacitor 140 are also disposed in the plurality of auxiliary sub-pixels SPA, similarly to the plurality of sub-pixels SP. The plurality of driving units DP are substantially the same as the plurality of driving units DP disposed in the plurality of sub-pixels SP. When a defect does not occur in the plurality of sub-pixels SP, the plurality of driving units DP disposed in the plurality of auxiliary sub-pixels SPA are not electrically connected to the auxiliary LEDs. On the other hand, when any one of the plurality of sub-pixels SP is defective, the plurality of driving units DP disposed in the plurality of auxiliary sub-pixels SPA can be electrically connected to the plurality of auxiliary LEDs.

Auxiliary pad electrodes PE are disposed in the plurality of auxiliary sub-pixels SPA. The auxiliary pad electrodes PE are electrodes for electrically connecting the driving units DP of the plurality of auxiliary sub-pixels SPA, and the plurality of lines and the auxiliary LEDs. Specifically, in the plurality of sub-pixels SP, a plurality of LEDs together with the plurality of driving units DP are formed on the upper surface of the substrate 110. That is, in the plurality of sub-pixels SP, the plurality of LEDs can be disposed on the same plane as the plurality of driving units DP. On the other hand, in the plurality of auxiliary sub-pixels SPA, when any one of the plurality of sub-pixels SP is defective, the auxiliary LED is transferred to an upper portion of the driving unit DP, so that the auxiliary LED and the driving unit DP can be disposed vertically. In addition, in order to electrically connect the driving unit DP and the auxiliary LED that are disposed on different planes, the auxiliary pad electrodes PE that penetrate the second passivation layer 113 can be disposed.

The auxiliary pad electrodes PE include a first auxiliary pad electrode PE1 and a second auxiliary pad electrode PE2.

The first auxiliary pad electrode PE1 is an electrode for electrically connecting the second transistor 130 and the auxiliary LED. The first auxiliary pad electrode PE1 can contact the second drain connection electrode 133E of the second transistor 130 through a contact hole formed in the second passivation layer 113.

The second auxiliary pad electrode PE2 is an electrode for electrically connecting the power line PL and the auxiliary LED. The second auxiliary pad electrode PE2 can contact the power line PL through a contact hole formed in the second passivation layer 113.

In addition, a contact hole that exposes the first auxiliary pad electrode PE1 is formed in the third passivation layer 114 formed on the first auxiliary pad electrode PE1, so that the first auxiliary pad electrode PE1 can be exposed to the outside. Similarly, a contact hole that exposes the second auxiliary pad electrode PE2 is formed in the third passivation layer 114 formed on the second auxiliary pad electrode PE2, so that the second auxiliary pad electrode PE2 can be exposed to the outside. Therefore, when transferring the auxiliary LED to the auxiliary sub-pixel SPA, the auxiliary LED can be connected to the first auxiliary pad electrode PE1 and the second auxiliary pad electrode PE2 that are exposed from the third passivation layer 114. In addition, the auxiliary LED can be electrically connected to the plurality of lines and the plurality of driving units DP.

Referring to FIG. 7, the first auxiliary LED 650 includes a first auxiliary n-type semiconductor layer 651, a first auxiliary emission layer 652, a first auxiliary p-type semiconductor layer 653, and a first auxiliary n-type electrode 654, and a first auxiliary p-type electrode 655.

The first auxiliary n-type semiconductor layer 651 is disposed on the first auxiliary p-type semiconductor layer 653. For example, the first auxiliary n-type semiconductor layer 651 can be formed by doping an n-type impurity in indium aluminum phosphide (InAlP), and the first auxiliary p-type semiconductor layer 653 can be formed by doping a p-type impurity in gallium arsenide (GaAs). For example, the p-type impurity can be magnesium (Mg), zinc (Zn), beryllium (Be), or the like, and the n-type impurity can be silicon (Si), germanium (Ge), tin (Sn), or the like, but the present disclosure is not limited thereto.

The first auxiliary emission layer 652 is disposed between the first auxiliary p-type semiconductor layer 653 and the first auxiliary n-type semiconductor layer 651. The first auxiliary emission layer 652 can emit light by receiving holes and electrons from the first auxiliary n-type semiconductor layer 651 and the first auxiliary p-type semiconductor layer 653. For example, the first auxiliary emission layer 652 can emit red light by receiving holes and electrons from the first auxiliary n-type semiconductor layer 651 and the first auxiliary p-type semiconductor layer 653. The first auxiliary emission layer 652 can be configured of a single layer or a multi-quantum well (MQW) structure and can be formed of, for example, indium gallium nitride (InGaN) or gallium nitride (GaN), but is not limited thereto.

A portion of the first auxiliary n-type semiconductor layer 651 protrudes outwardly of the first auxiliary emission layer 652 and the first auxiliary p-type semiconductor layer 653. The first auxiliary emission layer 652 and the first auxiliary p-type semiconductor layer 653 can have a size smaller than that of the first auxiliary n-type semiconductor layer 651 so as to expose a lower surface of the first auxiliary n-type semiconductor layer 651. The first auxiliary n-type semiconductor layer 651 can be exposed from the first auxiliary emission layer 652 and the first auxiliary p-type semiconductor layer 653 to be electrically connected to the first auxiliary n-type electrode 654.

The first auxiliary n-type electrode 654 is disposed on the lower surface of the first auxiliary n-type semiconductor layer 651 that is exposed from the first auxiliary emission layer 652 and the first auxiliary p-type semiconductor layer 653. In addition, the first auxiliary p-type electrode 655 is disposed on a lower surface of the first auxiliary p-type semiconductor layer 653. The first auxiliary n-type electrode 654 can come into contact with and be electrically connected to the lower surface of the first auxiliary n-type semiconductor layer 651. The first auxiliary p-type electrode 655 can come into contact with and be electrically connected to the lower surface of the first auxiliary p-type semiconductor layer 653.

In FIG. 7, only a structure of the first auxiliary LED 650 is illustrated, but the second auxiliary LED and the third auxiliary LED can be formed of an auxiliary n-type semiconductor layer, an auxiliary p-type semiconductor layer, an auxiliary emission layer, an auxiliary n-type electrode, and an auxiliary p-type electrode, like the first auxiliary LED 650, and the first auxiliary LED 650, the second auxiliary LED, and the third auxiliary LED can be substantially the same structure.

In addition, the plurality of LEDs are formed to have a lateral structure in which electrodes are horizontally disposed at upper portions of the LEDs, but the first auxiliary LED 650 is formed to have a flip chip structure in which electrodes are horizontally disposed at a lower portion of the LED. That is, the plurality of LEDs and the auxiliary LED can have different structures. In a case that the plurality of auxiliary LEDs have a lateral structure in which electrodes are disposed at upper portions of the LEDs or a vertical structure in which electrodes are disposed at upper and lower portions of the LEDs, a separate wiring process is further required after transferring the auxiliary LEDs. On the other hand, since the auxiliary LED has a flip-chip structure, a separate wiring process is unnecessary since the auxiliary LED can be bonded by applying heat and pressure after placing the auxiliary LED on the substrate. Accordingly, the plurality of LEDs that are directly formed on the substrate 110 and the auxiliary LEDs that are transferred to the substrate 110 can have different structures, but are not limited thereto.

Bumps BP are disposed between the first auxiliary LED 650 and the auxiliary pad electrodes PE. The bumps BP are for bonding the first auxiliary LED 650 to the auxiliary pad electrodes PE, and can be formed of gold (Au) or solder. In addition, the bumps BP can have different heights so that each of the first auxiliary n-type electrode 654 and the first auxiliary p-type electrode 655 having a step can be electrically connected to the auxiliary pad electrodes PE.

In FIG. 7, the plurality of auxiliary LEDs are bonded to the auxiliary pad electrodes PE using the bumps BP, but the plurality of auxiliary LEDs can be bonded to the auxiliary pad electrodes PE using a conductive connection member such as an anisotropic conductive film (ACF) or anisotropic conductive paste (ACP). A method of connecting the plurality of auxiliary LEDs and the auxiliary pad electrodes PE is not limited thereto.

Meanwhile, after electrically connecting the plurality of lines and the plurality of driving units DP to the plurality of LEDs during a manufacturing process of the display device 600, a lighting test of the plurality of LEDs can be performed. However, even if a defective LED is found during the lighting test, it can be difficult to perform a repair process in which the defective LED is removed and a new LED is disposed, due to the plurality of insulating layers, the plurality of lines, and the plurality of connection electrodes that are formed on the plurality of LEDs, in the plurality of sub-pixels SP. Accordingly, in the display device 600 according to another exemplary embodiment of the present disclosure, the plurality of auxiliary sub-pixels SPA can be further disposed, together with the plurality of sub-pixels SP to thereby facilitate repair of the display device 600.

Specifically, in the display device 600 according to another exemplary embodiment of the present disclosure, a plurality of auxiliary sub-pixels SPA in which a plurality of LEDs are not grown and only a plurality of driving units DP are formed are disposed, so that the display device 600 can be repaired in a method of transferring the auxiliary LED to the auxiliary sub-pixel SPA when the sub-pixel SP is defective. First, when forming the plurality of driving units DP, the driving unit DP can also be formed in the auxiliary sub-pixel SPA. In addition, after the plurality of driving units DP and the plurality of lines, and the plurality of LEDs are electrically connected in the plurality of sub-pixels SP, a lighting test can be performed. If a defective sub-pixel SP is found in the lighting test, the auxiliary LED can be transferred to the auxiliary sub-pixel SPA corresponding to the defective sub-pixel SP. At this time, by transferring a flip-chip type auxiliary LED to the auxiliary pad electrode PE exposed from the third passivation layer 114, the second transistor 130 of the auxiliary sub-pixel SPA and the power line PL, and the auxiliary LED can be electrically connected. Accordingly, in the display device 600 according to another exemplary embodiment of the present disclosure, when the driving units DP of the plurality of sub-pixels SP are formed, the driving units DP and the auxiliary pad electrodes PE are formed in the plurality of auxiliary sub-pixels SPA together, and the auxiliary LED is transferred to the auxiliary sub-pixel SPA when a defective sub-pixel SP occurs, so that the display device 600 can be easily repaired.

Figure 8:
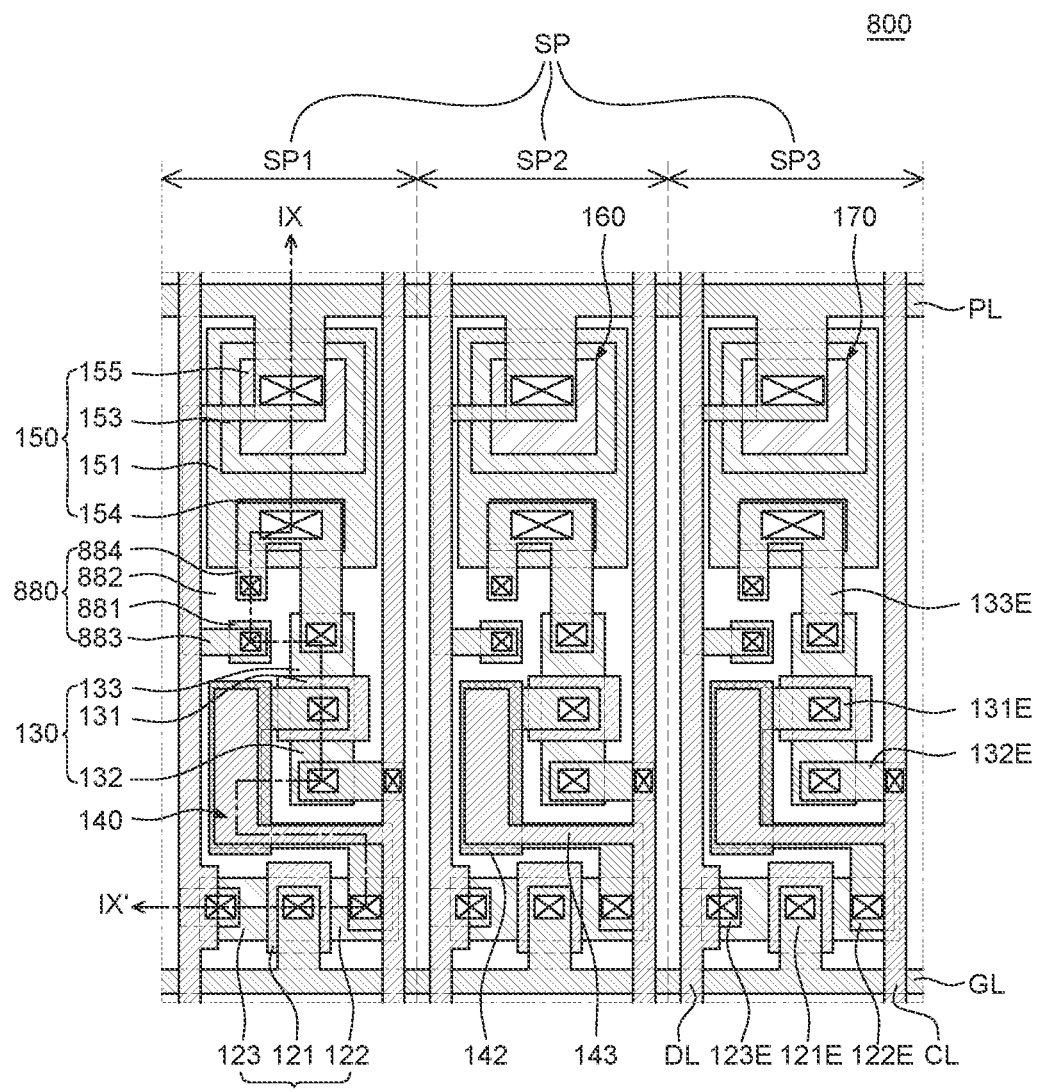
FIG. 8 is an enlarged plan view of the display device according to another exemplary embodiment of the present disclosure.
Figure 9A:
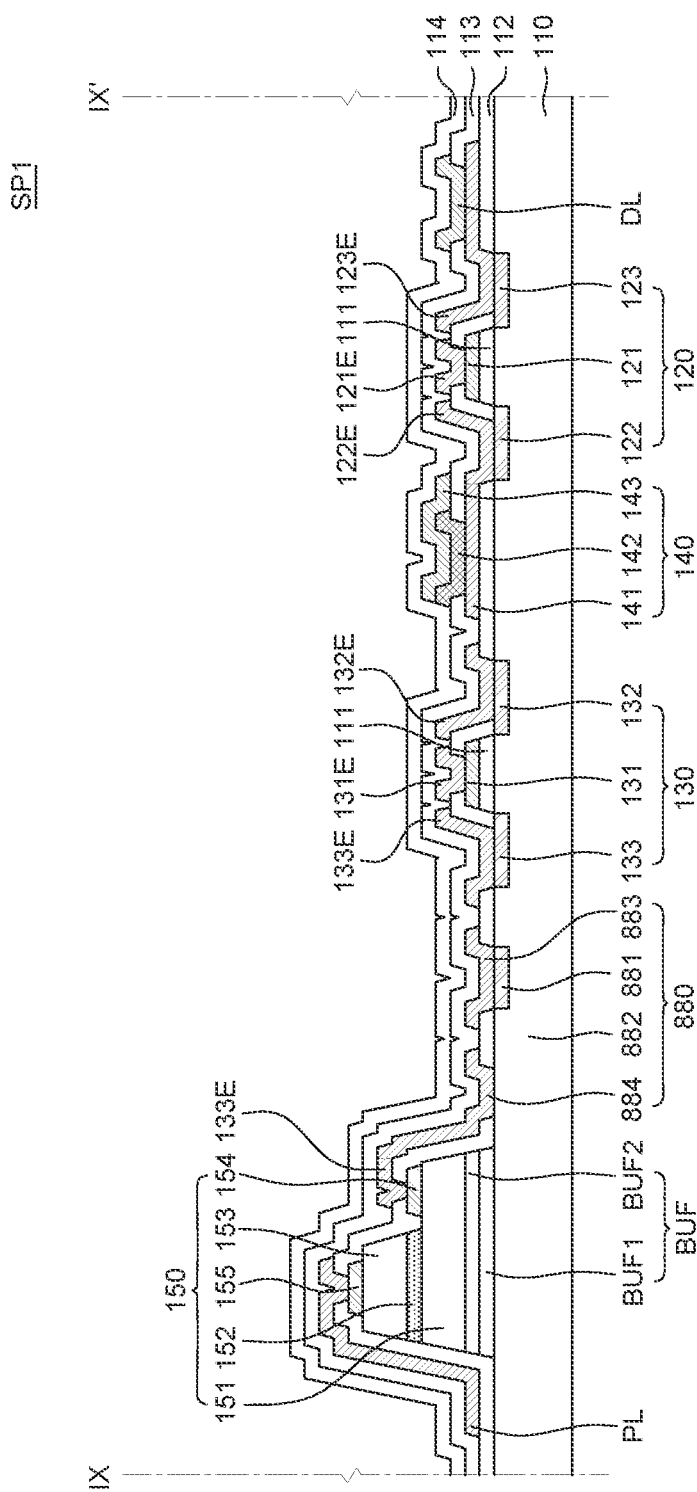
FIG. 9A and FIG. 9B are cross-sectional views taken along line IX-IX' of FIG. 8.
Figure 9B:
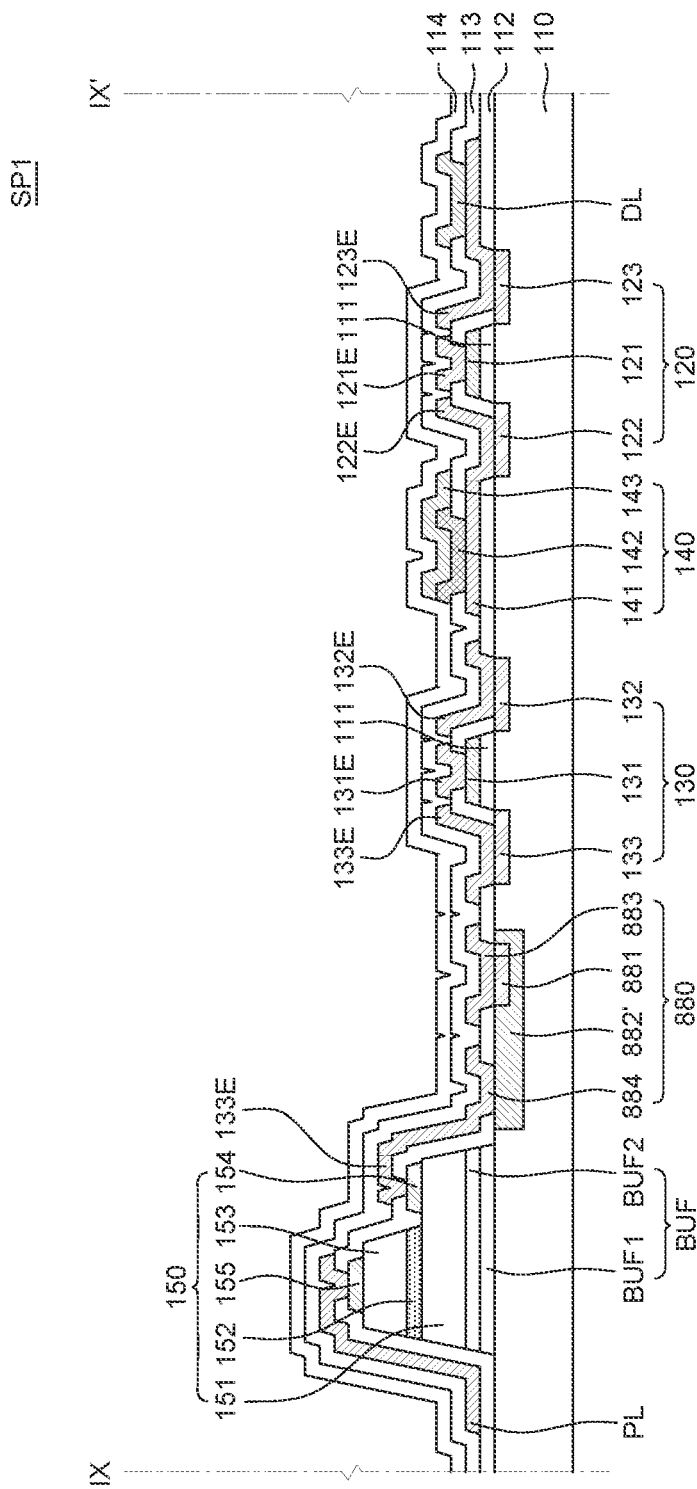

FIG. 8 is an enlarged plan view of a display device according to another exemplary embodiment of the present disclosure. FIG. 9A and FIG. 9B are cross-sectional views taken along line IX-IX' of FIG. 8. Since other configurations of a display device 800 of FIG. 8 to FIG. 9B are substantially identical to those of the display device 100 of FIG. 1 to FIG. 3B except that the display device 800 of FIG. 8 to FIG. 9B further includes Zener diodes 880, a redundant description will be omitted or may be briefly provided.

Referring to FIG. 8 and FIG. 9A, the Zener diodes 880 electrically connected to the plurality of LEDs are disposed. The Zener diodes 880 are elements that protect the plurality of LEDs from static electricity.

The Zener diode 880 includes an n-type region 881, a p-type region 882, a first Zener electrode 883 and a second Zener electrode 884.

The n-type region 881 is a region disposed on the substrate 110 and is a region doped with impurities having a polarity opposite to that of the substrate 110. For example, when the substrate 110 is a silicon substrate 110 doped with a p-type impurity, the n-type region 881 can be formed by doping an n-type impurity in the substrate 110.

The p-type region 882 is a region disposed on the substrate 110 and can contact the n-type region 881. For example, when the substrate 110 is a silicon substrate 110 doped with a p-type impurity, a remaining region of the substrate 110 excluding the n-type region 881 can be the p-type region 882. Accordingly, in the substrate 110 including both the n-type region 881 and the p-type region 882, the substrate 110 itself can function as one Zener diode 880.

Additionally, referring to FIG. 9B, characteristics of the Zener diode 880 can be improved by further doping a p-type impurity in the p-type substrate 110 at a high concentration. For example, a high-concentration p-type region 882' that is in contact with the n-type region 881 on the substrate 110 and doped with a p-type impurity at a high concentration is further formed, so that a width of a depletion layer of the Zener diode 880 can be formed in a narrow and uniform manner and a breakdown voltage can be increased. Accordingly, according to a design, the high-concentration p-type region 882' can be further formed on the substrate 110 to improve performance of the Zener diode 880.

Meanwhile, in the present disclosure, descriptions are made on the assumption that the substrate 110 is a silicon substrate 110 doped with a p-type impurity, but the substrate 110 can be a silicon substrate 110 doped with an n-type impurity. In this case, the p-type region 882 of the Zener diode 880 can be formed by doping a p-type impurity separately in the substrate 110, but is not limited thereto.

Referring to FIG. 9A, the first Zener electrode 883 electrically connects the n-type region 881 of the Zener diode 880 and the p-type semiconductor layer 153, 163 or 173 of each of the plurality of LEDs. For example, in the case of the first sub-pixel SP1, one end of the first Zener electrode 883 is in contact with the n-type region 881, and the other end of the first Zener electrode 883 can contact the power line PL electrically connected to the first p-type semiconductor layer 153 of the first LED 150. Accordingly, the n-type region 881 of the Zener diode 880 and the p-type semiconductor layer 153, 163 or 173 of each of the plurality of LEDs can be electrically connected to each other by the first Zener electrode 883.

The second Zener electrode 884 electrically connects the p-type region 882 of the Zener diode 880 and the n-type semiconductor layer 151, 161 or 171 of each of the plurality of LEDs. For example, in the case of the first sub-pixel SP1, one end of the second Zener electrode 884 can be in contact with the upper surface of the substrate 110, which is the p-type region 882, and the other end of the second Zener electrode 884 can be in contact with the second drain connection electrode 133E electrically connected to the first n-type semiconductor layer 151 of the first LED 150. Accordingly, the p-type region 882 of the Zener diode 880 and the n-type semiconductor layer 151, 161 or 171 of each of the plurality of LEDs can be electrically connected to each other by the second Zener electrode 884.

Meanwhile, as a thickness of an epitaxial layer, that is, a thickness of the plurality of LEDs increases and step differences between the plurality of LEDs and the plurality of driving units DP increase, it is difficult to perform a photo-process, thereby increasing a possibility of occurrence of short-circuits between the plurality of driving units DP and the plurality of lines, and it can be difficult to uniformly form the plurality of driving units DP and the plurality of lines and a material for forming the plurality of insulating layers on the substrate 110 due to the step differences. However, when the thickness of the epitaxial layer is reduced to decrease the step differences between the plurality of LEDs and the plurality of driving units DP, a possibility of occurrence of a defect in the epitaxial layer can increase, and the plurality of LEDs can be vulnerable to static electricity.

Accordingly, in the display device 800 according to another exemplary embodiment of the present disclosure, the thickness of the plurality of LEDs is reduced to decrease the step differences between the plurality of LEDs and the plurality of driving units DP, and at the same time, it is possible to improve electrostatic discharge characteristics of the plurality of LEDs. The plurality of LEDs can be formed by growing an epitaxial layer on the substrate 110. At this time, by forming an epitaxial layer having a small thickness, the step differences between the plurality of LEDs and the plurality of driving units DP can be reduced, and defects such as the occurrence of short-circuits between the plurality of driving units DP and the plurality of lines due to a difficulty in performing a photo-process can be minimized. In this case, since the Zener diode 880 is connected to each of the plurality of LEDs vulnerable to static electricity due to the small thickness thereof, the plurality of LEDs can be easily protected from static electricity.

In addition, in the display device 800 according to another exemplary embodiment of the present disclosure, by forming the Zener diodes 880 on the substrate 110 without a separate additional process, the plurality of LEDs can be protected from static electricity. First, the n-type regions 881 of the Zener diodes 880 can be formed by doping an n-type impurity in the substrate 110 doped with a p-type impurity. In this case, the n-type regions 881 can be formed in a process of doping an n-type impurity in the substrate 110, in order to form the first source regions 122 and the first drain regions 123 of the plurality of first transistors 120 and the second source regions 132 and the second drain regions 133 of the plurality of second transistors 130. Therefore, since the n-type regions 881 of the Zener diodes 880 can be formed together with the first transistors 120 and the second transistors 130 during a process of forming the first transistors 120 and the second transistors 130, an additional process for forming the Zener diodes 880 is not required. In addition, since the substrate 110 is a silicon substrate 110 doped with a p-type impurity, the Zener diode 880 can be configured by utilizing the p-type region 882 of the Zener diode 880 in a portion of a remainder of the substrate 110 except for the n-type region 881. In addition, since the first Zener electrode 883 is integrally formed with the power line PL, and the second Zener electrode 884 is formed integrally with the second drain connection electrode 133E, the first Zener electrode 883 and the second Zener electrode 884 can be formed by the same process as the power line PL and the second drain connection electrode 133E. Accordingly, the first Zener electrode 883 and the second Zener electrode 884 can be formed without a separate additional process. Therefore, in the display device 800 according to another exemplary embodiment of the present disclosure, since the Zener diode 880 is formed using a process of forming the plurality of driving units DP and the plurality of lines, the Zener diode 880 can be formed without an additional process and it is possible to easily protect the plurality of LEDs from static electricity.

Figure 10:
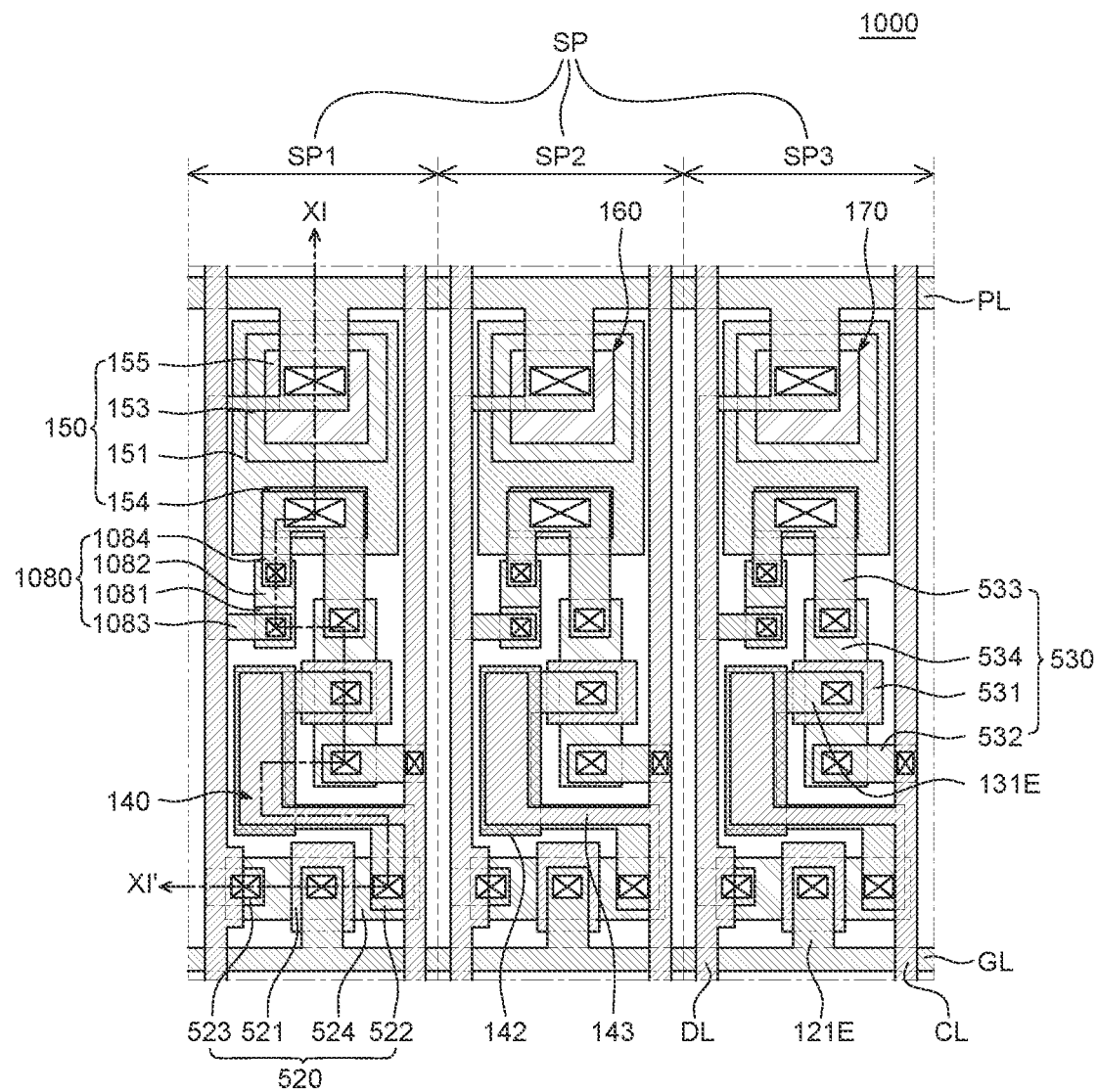
FIG. 10 is an enlarged plan view of a display device according to another exemplary embodiment of the present disclosure.
Figure 11:
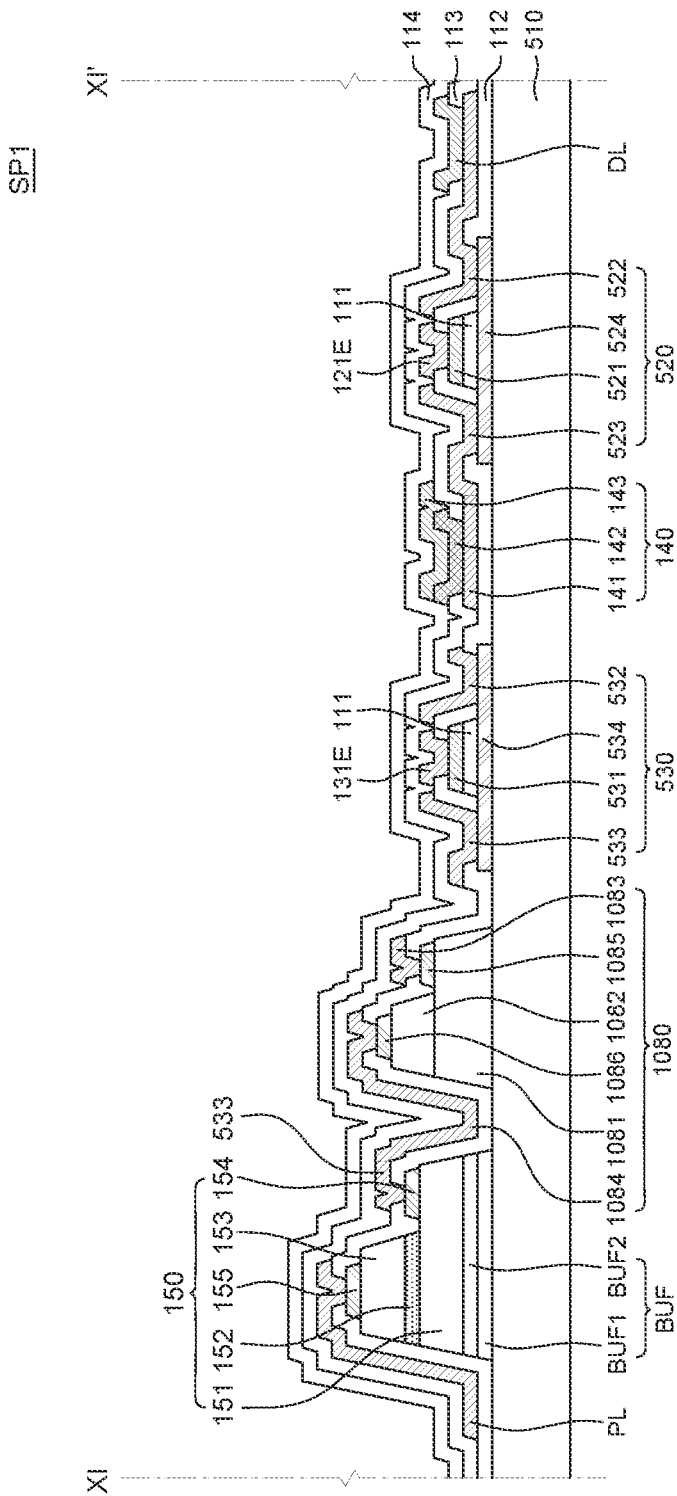
FIG. 11 is a cross-sectional view taken along line XI-XI' of FIG. 10.

FIG. 10 is an enlarged plan view of a display device according to another exemplary embodiment of the present disclosure. FIG. 11 is a cross-sectional view taken along line XI-XI' of FIG. 10. Since other configurations of a display device 1000 of FIG. 10 are substantially identical to those of the display device 500 of FIG. 5 except that the display device 1000 of FIG. 10 further includes Zener diodes 1080, a redundant description will be omitted or may be briefly provided.

Referring to FIG. 10, the Zener diode 1080 is disposed in each of a plurality of sub-pixels SP on a substrate 510. The Zener diode 1080 can be disposed in each of the plurality of sub-pixels SP to be electrically connected to each of the plurality of LEDs. In this case, the substrate 510 is a sapphire substrate 510, and instead of doping the substrate 510 with impurities, the Zener diode 1080 can be formed using the same material and process as the epitaxial layer of the plurality of LEDs.

The Zener diode 1080 includes an n-type semiconductor layer 1081, a p-type semiconductor layer 1082, an n-type electrode 1085, a p-type electrode 1086, a first Zener electrode 1083, and a second Zener electrode 1084.

First, the n-type semiconductor layer 1081 is disposed on the substrate 510 and the p-type semiconductor layer 1082 is disposed on the n-type semiconductor layer 1081. The n-type semiconductor layer 1081 and the p-type semiconductor layer 1082 can be layers formed by doping an n-type impurity and a p-type impurity in a material such as gallium nitride (GaN). For example, the p-type impurity can be magnesium (Mg), zinc (Zn), beryllium (Be), or the like, and the n-type impurity can be silicon (Si), germanium (Ge), tin (Sn) or the like, but is not limited thereto.

A portion of the n-type semiconductor layer 1081 of the Zener diode 1080 protrudes outwardly of the p-type semiconductor layer 1082. The p-type semiconductor layer 1082 can have a size smaller than that of the n-type semiconductor layer 1081 so as to expose an upper surface of the n-type semiconductor layer 1081. The n-type semiconductor layer 1081 can protrude outwardly of the p-type semiconductor layer 1082 to be electrically connected to the n-type electrode 1085 and the first Zener electrode 1083.

Meanwhile, the n-type semiconductor layer 1081 and the p-type semiconductor layer 1082 of the Zener diode 1080 can be formed by the same process as at least one of the plurality of LEDs. For example, the n-type semiconductor layer 1081 and the p-type semiconductor layer 1082 of the Zener diode 1080 can be formed together with the second epitaxial layer 160m for forming the second LED 160 or the third epitaxial layer 170m for forming the third LED 170.

For example, an insulating layer that exposes areas where the plurality of second LEDs 160 and the Zener diodes 1080 are to be formed can be formed on the substrate 510. Subsequently, the second n-type semiconductor material layer 161m and the second p-type semiconductor material layer 163m of the second epitaxial layer 160m are grown in the area where the Zener diode 1080 is to be formed among areas exposed from the insulating layer, so that the n-type semiconductor layer 1081 and the p-type semiconductor layer 1082 of the Zener diode 1080 can be formed. For another example, when growing the third epitaxial layer 170m, the third n-type semiconductor material layer 171m and the third p-type semiconductor material layer 173m of the third epitaxial layer 170m are grown in the area where the Zener diode 1080 is to be formed among the areas exposed from the insulating layer, so that the n-type semiconductor layer 1081 and the p-type semiconductor layer 1082 of the Zener diode 1080 can be formed.

The n-type electrode 1085 is disposed on the n-type semiconductor layer 1081 of the Zener diode 1080, and the p-type electrode 1086 is disposed on the p-type semiconductor layer 1082. The n-type electrode 1085 can be disposed on an upper surface of the n-type semiconductor layer 1081 that protrudes outwardly of the p-type semiconductor layer 1082, and the p-type electrode 1086 can be disposed on an upper surface of the p-type semiconductor layer 1082.

The first Zener electrode 1083 is disposed on the first passivation layer 112. The first Zener electrode 1083 electrically connects the n-type semiconductor layer 1081 of the Zener diode 1080 and the p-type semiconductor layer 153, 163, or 173 of each of the plurality of LEDs. Specifically, one end of the first Zener electrode 1083 can contact the n-type electrode 1085 of the Zener diode 1080 through a contact hole formed in the first passivation layer 112, and the other end of the first Zener electrode 1083 can contact the p-type electrode 155, 165 or 175 of each of the plurality of LEDs or contact the p-type semiconductor layer 153, 163, or 173 of each of the plurality of LEDs through a contact hole of the first passivation layer 112. Accordingly, the n-type semiconductor layer 1081 of the Zener diode 1080 and the p-type semiconductor layer 153, 163 or 173 of each of the plurality of LEDs can be electrically connected through the first Zener electrode 1083 on the first passivation layer 112.

The second Zener electrode 1084 is disposed on the first passivation layer 112. The second Zener electrode 1084 electrically connects the p-type semiconductor layer 1082 of the Zener diode 1080 and the n-type semiconductor layer 151, 161 or 171 of each of the plurality of LEDs. Specifically, one end of the second Zener electrode 1084 can contact the p-type electrode 1086 of the Zener diode 1080 through a contact hole formed in the first passivation layer 112, and the other end of the second Zener electrode 1084 can contact the n-type electrode 154, 164 or 174 of each of the plurality of LEDs or contact the n-type semiconductor layer 151, 161 or 171 of each of the plurality of LEDs through a contact hole of the first passivation layer 112. Accordingly, the p-type semiconductor layer 1082 of the Zener diode 1080 and the n-type semiconductor layer 151, 161 or 171 of each of the plurality of LEDs can be electrically connected through the second Zener electrode 1084 on the first passivation layer 112.

The display device 1000 according to another exemplary embodiment of the present disclosure can protect the plurality of LEDs from static electricity by forming the Zener diodes 1080 without a separate additional process. When the substrate 510 is sapphire, the n-type semiconductor layer 1081 and the p-type semiconductor layer 1082 of the Zener diode 1080 can be formed together with the epitaxial layer of the plurality of LEDs when the epitaxial layer of the plurality of LEDs is grown. When the n-type semiconductor material layer and the p-type semiconductor material layer of the epitaxial layer are grown, the n-type semiconductor layer 1081 and the p-type semiconductor layer 1082 of the Zener diode 1080 can be grown together with the n-type semiconductor material layer and the p-type semiconductor material layer of the epitaxial layer. Therefore, when forming a plurality of LEDs, the n-type semiconductor layer 1081 and the p-type semiconductor layer 1082 of the Zener diode 1080 can be formed together with the plurality of LEDs, and an additional process is not required. The n-type electrode 1085 and the p-type electrode 1086 of the Zener diode 1080 can be formed in the same process as the n-type electrodes 154, 164, 174 and p-type electrodes 155, 165, 175 of each of the plurality of LEDs. The first Zener electrode 1083 integrally formed with the power line PL and the second Zener electrode 1084 integrally formed with the second drain electrode 533 can be formed in the same process as the power line PL and the second drain electrode 533. Therefore, since the Zener diodes 1080 can be formed when forming the plurality of LEDs, the plurality of driving units DP, and the plurality of lines, an additional process for forming the Zener diodes 1080 is not required, and reliability of the plurality of LEDs for the static electricity can be improved.

The exemplary embodiments of the present disclosure can also be described as follows:

According to an aspect of the present disclosure, there is provided a display device. The display device includes a substrate on which a plurality of sub-pixels are defined, a plurality of light emitting diodes (LEDs) including a first LED, a second LED, and a third LED that are disposed in the plurality of respective sub-pixels on the substrate, and at least one buffer layer disposed between the first LED and the substrate. The first LED is in contact with an upper surface of the at least one buffer layer, and the second LED and the third LED are in contact with an upper surface of the substrate.

The first LED can include a first n-type semiconductor layer in contact with the upper surface of the at least one buffer layer, the second LED can include a second n-type semiconductor layer in contact with the upper surface of the substrate, and the third LED can include a third n-type semiconductor layer in contact with the upper surface of the substrate. A difference in lattice constant between the first n-type semiconductor layer and the substrate can be greater than a difference in lattice constant between the second n-type semiconductor layer and the substrate and a difference in lattice constant between the third n-type semiconductor layer and the substrate.

A difference in lattice constant between the first n-type semiconductor layer and the at least one buffer layer can be smaller than the difference in lattice constant between the first n-type semiconductor layer and the substrate.

The display device can further include a plurality of driving units and a plurality of lines that are disposed in each of the plurality of sub-pixels on the substrate and electrically connected to each of the plurality of LEDs. The plurality of driving units can include a transistor and at least a portion of the transistor can be in contact with the upper surface of the substrate.

The substrate can be a silicon substrate doped with an impurity. The transistor can include a source region and a drain region that are doped with an impurity having a polarity opposite to that of the substrate and disposed on the substrate. The at least one buffer layer can include a germanium buffer layer.

The display device can further include a plurality of Zener diodes electrically connected to the plurality of LEDs. Each of the plurality of Zener diodes can include an n-type region disposed on the substrate and doped with the impurity having the polarity opposite to that of the substrate, a first Zener electrode electrically connecting the n-type region and a p-type semiconductor layer of each of the plurality of LEDs, and a second Zener electrode electrically connecting the substrate and an n-type semiconductor layer of each of the plurality of LEDs.

The substrate can be a sapphire substrate. The transistor can include a source electrode and a drain electrode disposed on the substrate. The at least one buffer layer can include a graphene buffer layer.

The display device can further include a plurality of Zener diodes electrically connected to the plurality of LEDs. Each of the plurality of Zener diodes can include an n-type semiconductor layer disposed on the substrate, a p-type semiconductor layer disposed on the n-type semiconductor layer, a first Zener electrode electrically connecting the n-type semiconductor layer and a p-type semiconductor layer of each of the plurality of LEDs, and a second Zener electrode electrically connecting the p-type semiconductor layer and an n-type semiconductor layer of each of the plurality of LEDs.

The display device can further include a plurality of auxiliary sub-pixels defined on the substrate, a plurality of driving units disposed in each of the plurality of sub-pixels and the plurality of auxiliary sub-pixels, and auxiliary LEDs disposed on the plurality of driving units in any one of the plurality of auxiliary sub-pixels. The auxiliary LEDs and the plurality of driving units can overlap vertically, and the plurality of LEDs can be disposed on the same plane as at least a part of the plurality of driving units.

The display device can further include at least one insulating layer covering the plurality of LEDs and the plurality of driving units of the plurality of sub-pixels, and the plurality of driving units of the plurality of auxiliary sub-pixels, and auxiliary pad electrodes exposed from the at least one insulating layer and electrically connecting the auxiliary LEDs and the plurality of driving units of the plurality of auxiliary sub-pixels.

The first LED can be a red LED, one of the second LED and the third LED can be a green LED, and the other of the second LED and the third LED can be a blue LED.

According to another aspect of the present disclosure, there is provided a method of manufacturing a display device. The method of manufacturing a display device includes forming at least one buffer layer in a partial region of a substrate and growing a first epitaxial layer on an upper surface of the at least one buffer layer, growing a second epitaxial layer on the upper surface of the substrate in another partial area of the substrate, growing a third epitaxial layer on the upper surface of the substrate in another partial area of the substrate, forming a plurality of LEDs by etching portions of the first epitaxial layer, the second epitaxial layer, and the third epitaxial layer and forming an n-type electrode and a p-type electrode on upper portions of the respective first epitaxial layer, second epitaxial layer, and third epitaxial layer that are etched, and forming a plurality of driving units in a remaining area of the substrate. A difference in lattice constant between a lower portion of the first epitaxial layer and the substrate is greater than a difference between a lower portion of the second epitaxial layer and the substrate.

The forming of the at least one buffer layer and the growing of the first epitaxial layer can include forming a first insulating layer that exposes a partial area of the substrate, on the upper surface of the substrate, growing the first epitaxial layer on the upper surface of the at least one buffer layer that is exposed from the first insulating layer, and removing the first insulating layer.

The growing of the second epitaxial layers can include forming a second insulating layer that covers the first epitaxial layer and the at least one buffer layer and exposes another partial area of the substrate, growing a second epitaxial layer on the upper surface of the substrate exposed from the second insulating layer, and removing the second insulating layer.

The growing of the third epitaxial layers can include forming a third insulating layer that covers the first epitaxial layer, the at least one buffer layer, and the second epitaxial layer and exposes another partial region of the substrate, growing a third epitaxial layer on the upper surface of the substrate that is exposed from the third insulating layer, and removing the third insulating layer.

The forming of the plurality of driving units can include forming a source region and a drain region by doping an impurity having a polarity opposite to that of the substrate in a remaining area of the substrate, and forming a gate electrode between the source region and the drain region. The substrate can be a substrate doped with a p-type impurity.

The method can further include forming a plurality of Zener diodes on the substrate. The forming of the plurality of Zener diodes can include doping an n-type impurity in the substrate to form an n-type region, forming a first Zener electrode electrically connecting the n-type region and each of the plurality of LEDs, and forming a second Zener electrode electrically connecting the substrate and each of the plurality of LEDs.

The forming of the plurality of Zener diodes can further include forming a high-concentration p-type region by doping a p-type impurity in the substrate at a high concentration. The forming of the second Zener electrode can include forming the second Zener electrode to electrically connect the high-concentration p-type region of the substrate and each of the plurality of LEDs.

The forming of the plurality of driving units can include forming a source electrode and a drain electrode on the substrate, and forming a gate electrode between the source electrode and the drain electrode. The substrate can be a sapphire substrate.

The growing of the second epitaxial layer can include growing a second n-type semiconductor layer on the upper surface of the substrate, growing a second emission layer on the second n-type semiconductor layer, and growing a second p-type semiconductor layer on the second emission layer.

The method can further include forming a plurality of Zener diodes on the substrate. The forming of the plurality of Zener diodes on the substrate can include growing an n-type semiconductor layer on the upper surface of the substrate, growing a p-type semiconductor layer on the n-type semiconductor layer, forming a first Zener electrode electrically connecting the n-type semiconductor layer and each of the plurality of LEDs, and forming a second Zener electrode electrically connecting the p-type semiconductor layer and each of the plurality of LEDs. The growing of the n-type semiconductor layer can be performed simultaneously with the growing of the second n-type semiconductor layer. The growing of the p-type semiconductor layer can be performed simultaneously with the growing of the second p-type semiconductor layer.

The method can further include transferring an auxiliary LED onto any one of the plurality of driving units. A portion of the plurality of driving units can be electrically connected to the plurality of LEDs, another portion of the plurality of driving units can be electrically connected to the auxiliary LED, and a remainder of the plurality of driving units can be not connected to the plurality of LEDs and the auxiliary LED.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate on which a plurality of sub-pixels are defined;
a plurality of light emitting diodes (LEDs) including a first LED, a second LED, and a third LED that are disposed in the plurality of respective sub-pixels on the substrate; and
at least one buffer layer disposed between the first LED and the substrate, the display device, further comprising: a plurality of auxiliary sub-pixels defined on the substrate; a plurality of driving units disposed in each of the plurality of sub-pixels and the plurality of auxiliary sub-pixels; and auxiliary LEDs disposed on the plurality of driving units in any one of the plurality of auxiliary sub-pixels, wherein the auxiliary LEDs and the plurality of driving units overlap vertically, and the plurality of LEDs are disposed on a same plane as at least a part of the plurality of driving units.

2. The display device of claim 1, wherein the first LED includes a first n-type semiconductor layer in contact with the upper surface of the at least one buffer layer, the second LED includes a second n-type semiconductor layer in contact with the upper surface of the substrate, and the third LED includes a third n-type semiconductor layer in contact with the upper surface of the substrate, and
wherein a difference in lattice constant between the first n-type semiconductor layer and the substrate is greater than a difference in lattice constant between the second n-type semiconductor layer and the substrate, and a difference in lattice constant between the third n-type semiconductor layer and the substrate.

3. The display device of claim 2, wherein a difference in lattice constant between the first n-type semiconductor layer and the at least one buffer layer is less than the difference in lattice constant between the first n-type semiconductor layer and the substrate.

4. The display device of claim 1, further comprising:
a plurality of driving units and a plurality of lines that are disposed in each of the plurality of sub-pixels on the substrate and electrically connected to the plurality of LEDs,
wherein the plurality of driving units include a transistor and at least a portion of the transistor is in contact with the upper surface of the substrate.

5. The display device of claim 4, wherein the substrate is a silicon substrate doped with an impurity,
wherein the transistor includes a source region and a drain region that are doped with an impurity having a polarity opposite to that of the substrate and disposed on the substrate, and
wherein the at least one buffer layer includes a germanium buffer layer.

6. The display device of claim 5, further comprising:
a plurality of Zener diodes electrically connected to the plurality of LEDs,
wherein each of the plurality of Zener diodes includes:
an n-type region disposed on the substrate and doped with the impurity having the polarity opposite to that of the substrate;
a first Zener electrode electrically connecting the n-type region and a p-type semiconductor layer of a corresponding one of the plurality of LEDs; and
a second Zener electrode electrically connecting the substrate and an n-type semiconductor layer of the corresponding one of the plurality of LEDs.

7. The display device of claim 4, wherein the substrate is a sapphire substrate,
wherein the transistor includes a source electrode and a drain electrode disposed on the substrate, and
wherein the at least one buffer layer includes a graphene buffer layer.

8. The display device of claim 7, further comprising:
a plurality of Zener diodes electrically connected to the plurality of LEDs,
wherein each of the plurality of Zener diodes includes:
an n-type semiconductor layer disposed on the substrate;
a p-type semiconductor layer disposed on the n-type semiconductor layer;
a first Zener electrode electrically connecting the n-type semiconductor layer and a p-type semiconductor layer of a corresponding one of the plurality of LEDs; and
a second Zener electrode electrically connecting the p-type semiconductor layer and an n-type semiconductor layer of the corresponding one of the plurality of LEDs.

9. The display device of claim 1, further comprising: at least one insulating layer covering the plurality of LEDs and the plurality of driving units of the plurality of sub-pixels, and the plurality of driving units of the plurality of auxiliary sub-pixels; and auxiliary pad electrodes exposed from the at least one insulating layer and electrically connecting the auxiliary LEDs and the plurality of driving units of the plurality of auxiliary sub-pixels.

10. The display device of claim 1, wherein the first LED is a red LED, one of the second LED and the third LED is a green LED, and the other of the second LED and the third LED is a blue LED.

* * * * *